US012757407B2

(12) United States Patent
Neumann et al.

(10) Patent No.: US 12,757,407 B2
(45) Date of Patent: Oct. 6, 2026

(54) REPLACEMENT ELECTRODE PROCESS FOR 3D FERROELECTRIC MEMORY

(71) Applicant: Intel Corporation, Santa Clara, CA (US)

(72) Inventors: Christopher Neumann, Portland, OR (US); Cory Weinstein, Portland, OR (US); Nazila Haratipour, Portland, OR (US); Brian Doyle, Portland, OR (US); Sou-Chi Chang, Portland, OR (US); Tristan Tronic, Aloha, OR (US); Shriram Shivaraman, Hillsboro, OR (US); Uygar Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 74 days.

(21) Appl. No.: 17/957,603

(22) Filed: Sep. 30, 2022

(65) Prior Publication Data

US 2024/0114696 A1 Apr. 4, 2024

(51) Int. Cl.

| | |
|---|---|
| ***H10B 53/30*** | (2023.01) |
| ***H10B 53/20*** | (2023.01) |
| ***H10D 1/00*** | (2025.01) |
| ***H10D 1/68*** | (2025.01) |

(52) U.S. Cl.

CPC ............. *H10B 53/30* (2023.02); *H10B 53/20* (2023.02); *H10D 1/041* (2025.01); *H10D 1/682* (2025.01); *H10D 1/692* (2025.01)

(58) Field of Classification Search

CPC ........ H10B 53/30; H10B 53/20; H10D 1/682; H10D 1/041

See application file for complete search history.

(56) References Cited

U.S. PATENT DOCUMENTS

| | | | | |
|---|---|---|---|---|
| 2020/0006352 | A1* | 1/2020 | Avci | H01L 23/5223 |
| 2020/0411522 | A1* | 12/2020 | Tang | H10B 12/48 |
| 2022/0130862 | A1* | 4/2022 | Lue | H10B 41/10 |
| 2022/0302143 | A1* | 9/2022 | Cheng | H01L 21/02565 |
| 2022/0367493 | A1* | 11/2022 | Lee | H10B 53/30 |
| 2023/0048842 | A1* | 2/2023 | Lin | H10B 53/30 |

* cited by examiner

*Primary Examiner* — Eliseo Ramos Feliciano
*Assistant Examiner* — Brad A Knudson
(74) *Attorney, Agent, or Firm* — Essential Patents Group, LLP

(57) ABSTRACT

Multiple-ferroelectric capacitor structures in memory devices, including in integrated circuit devices, and techniques for forming the structures. Insulators separating individual outer plates in a ferroelectric capacitor array are supported between wider portions of a shared, inner plate. Wider portions of an inner plate may be formed in lateral recesses between insulating layers. Ferroelectric material may be deposited over the inner plate between insulating layers after removing sacrificial layers. An etch-stop layer may protect the inner plate when sacrificial layers are removed. An etch-stop or interface layer may remain over the inner plate adjacent insulators.

15 Claims, 14 Drawing Sheets

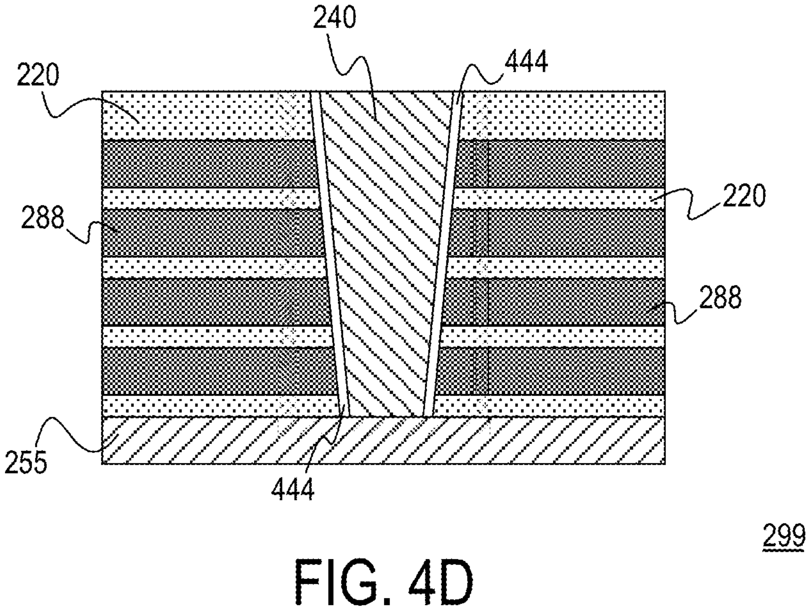
FIG. 4D
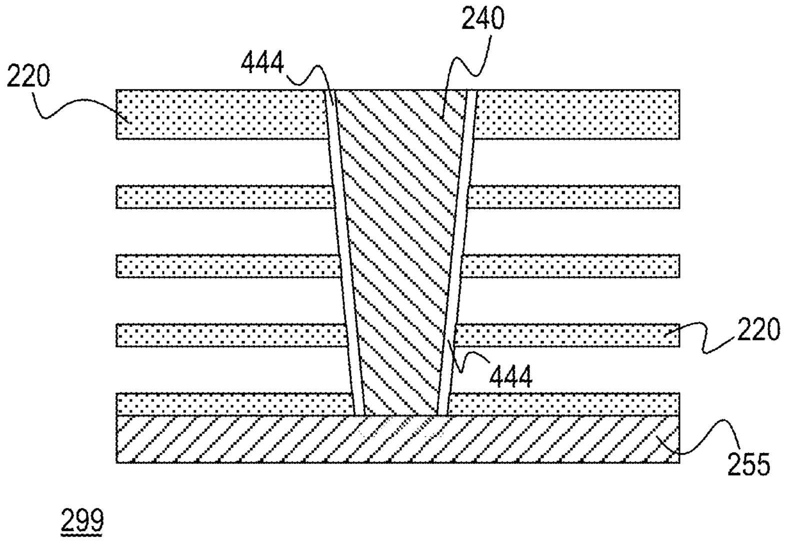
FIG. 4E
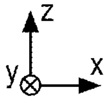

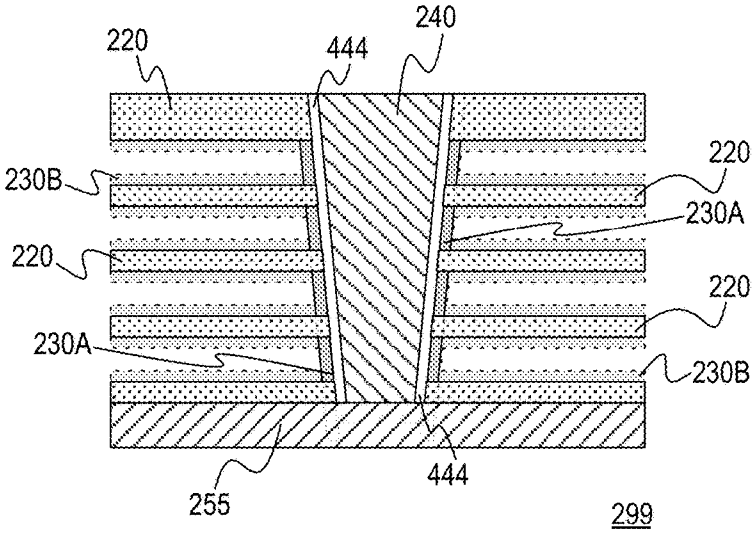
FIG. 4I
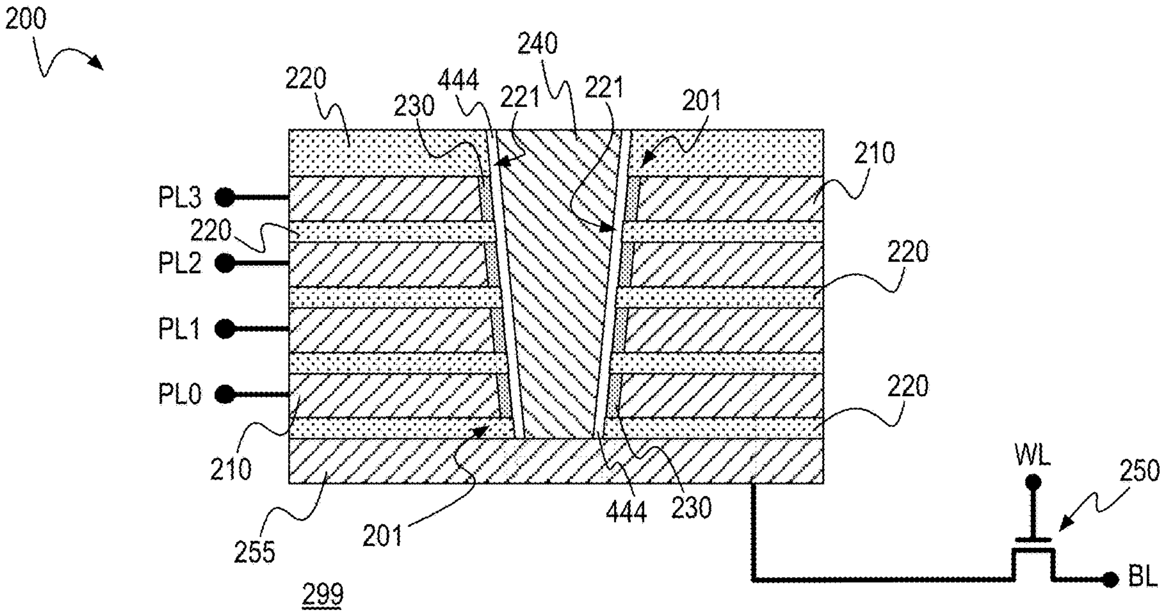
FIG. 4J
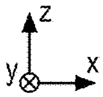

501

501

REPLACEMENT ELECTRODE PROCESS FOR 3D FERROELECTRIC MEMORY

BACKGROUND

Memory devices using random-access memory (RAM) may be improved by the use of ferroelectric material in ferroelectric RAM (FeRAM) storage arrays. FeRAM provides the benefit of non-volatility, e.g., for improved reliability and longer data retention times, as well as low power usage and fast write speeds.

However, the widespread implementation of FeRAM in memory systems is impeded by storage capacity limitations and high costs. Further, FeRAM fabrication process improvements are needed to increase process margins and reduce manufacturing inefficiencies and related costs. Some such costs, and associated reliability problems, may be caused by fragile FeRAM structures and consequent defects.

Thus, a need exists for FeRAM systems with increased storage densities and correspondingly lower costs using improved manufacturing processes and more reliable storage array structures.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements, e.g., with the same or similar functionality. The disclosure will be described with additional specificity and detail through use of the accompanying drawings:

FIGS. 4A, 4B, 4C, 4D, 4E, 4F, 4G, 4H, 4I, and 4J illustrate cross-sectional profile views of a memory device, including an array of ferroelectric capacitors with an inner plate encircled by an interface layer and ferroelectric layers, at various stages of manufacture, in accordance with some embodiments;

DETAILED DESCRIPTION

Figure 1:
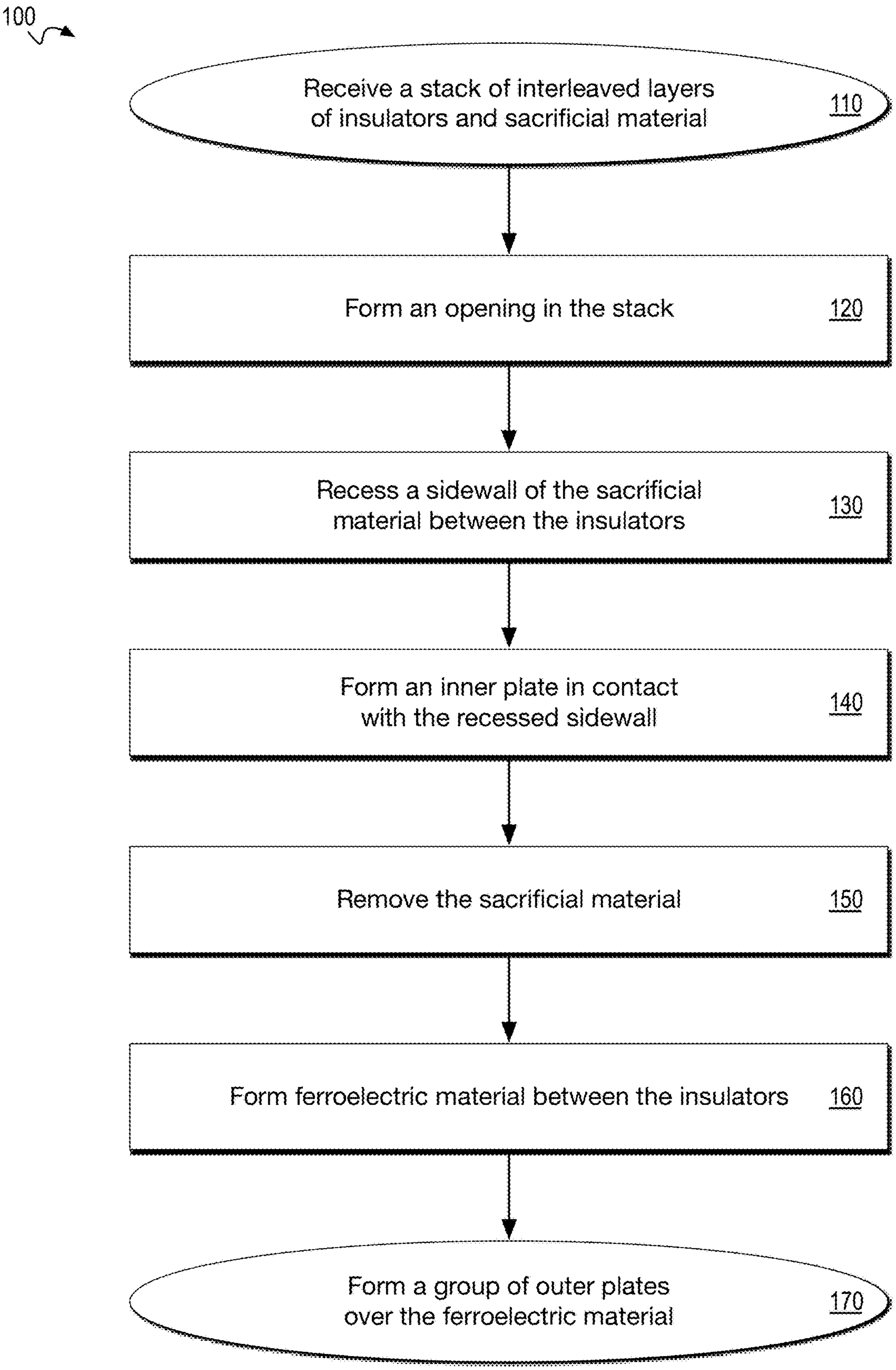
FIG. 1 is a flow chart of methods for forming a memory device, including forming an array of ferroelectric capacitors with multiple outer plates around a shared inner plate, in accordance with some embodiments.

In the following detailed description, reference is made to the accompanying drawings that show, by way of illustration, specific embodiments in which the claimed subject matter may be practiced. These embodiments are described in sufficient detail to enable those skilled in the art to practice the subject matter. The various embodiments, although different, are not necessarily mutually exclusive. For example, a particular feature, structure, or characteristic described herein, in connection with one embodiment, may be implemented within other embodiments without departing from the spirit and scope of the claimed subject matter.

References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "coupled" and "connected," along with their derivatives, may be used herein to describe structural relationships between components. These terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and recitations of "top," "bottom," "above," and "below" refer to relative positions in the z-dimension with the usual meaning. However, embodiments are not necessarily limited to the orientations or configurations illustrated in the figure.

The terms "substantially," "close," "approximately," "near," and "about," generally refer to being within +/−10% of a target value (unless specifically specified). Unless otherwise specified in the specific context of use, the term "predominantly" means more than 50%, or more than half. For example, a composition that is predominantly a first constituent means more than half of the composition is the first constituent. The term "primarily" means the most, or greatest, part. For example, a composition that is primarily a first constituent means the composition has more of the first constituent than any other constituent. A composition that is primarily first and second constituents means the composition has more of the first and second constituents than any other constituent.

Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional," "profile," and "plan" correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Materials, structures, and techniques are disclosed to improve memory devices having three-dimensional (3D) ferroelectric capacitor arrays. Ferroelectric memory devices have multiple benefits, including long and reliable data retention, low power usage, and fast write times, and 3D ferroelectric capacitor arrays enable increased storage density, e.g., in integrated circuit (IC) dies by stacking multiple ferroelectric capacitors over each other and a single access transistor. These compact, ferroelectric memory devices may be used in integrated memory applications, e.g., where memory arrays are located adjacent logic circuitry. Such a 3D ferroelectric capacitor array may have a central electrode (such as via metallization) as a shared inner plate and multiple outer plates surrounding the inner plate and intervening thin layers of ferroelectric material. This central electrode can be formed in an opening made through a stack of alternating layers of insulating material and a sacrificial material. Ferroelectric layers can be deposited after removing the sacrificial material, and outer plates can be formed over the ferroelectric layers.

However, removal of the sacrificial layers might be by a process not completely selective to the sacrificial material. For example, an etch that removes the sacrificial material may also remove some of the central electrode that the etch is exposing. Because of this, the remaining insulating layers may become detached from the central electrode and collapse. While a more selective etch might solve this problem, a more selective etch may not exist, may require additional development, or may have other drawbacks (e.g., longer process time, expensive or otherwise inconvenient chemistries).

In some embodiments described further below, an etch-stop layer (or interface layer) between the inner plate and the layers of insulating material facilitates the removal of the sacrificial material while preserving the inner electrode. The inner plate can be exposed by removing the interface layer between the insulating layers, or the interface layer may be retained between the insulating layers. Accordingly, the interface layer may be an electrically conductive material or an electrical insulator.

In some other embodiments described further below, structural support for the insulating layers is provided by an inner electrode having wider sections between adjacent insulating layers. In some embodiments, a sidewall of the sacrificial material is recessed, laterally from the opening and between adjacent insulating layers, before the inner plate is formed in the opening. The inner plate may then be formed within the recesses to have wider sections below and above the insulating layers. In some such embodiments, the wider sections each correspond to individual ferroelectric capacitors with the insulating layers between the outer plates of vertically adjacent ferroelectric capacitors.

FIG. 1 is a flow chart of methods 100 for forming a memory device, including forming an array of ferroelectric capacitors with multiple outer plates around a shared inner plate, in accordance with some embodiments. The array may be formed about an opening in a stack of materials over an access transistor coupled to the shared plate. Methods 100 include operations 110-170. Some operations shown in FIG. 1 are optional. FIG. 1 shows an example sequence, but the operations can be done in other orders as well, and some operations may be omitted. Some operations can also be performed multiple times before other operations are performed. For example, ferroelectric material may be deposited and modified multiple times, before any outer plates are formed over ferroelectric material, etc. Some operations may be included within other operations so that the number of operations illustrated FIG. 1 is not a limitation of the methods 100.

Methods 100 begin with forming an opening in an interleaved stack of insulating and sacrificial layers. In some embodiments, forming the opening in the stack of layers exposes a metallization structure coupled to a source or drain contact of an access transistor, e.g., below the interleaved stack. The formed memory device may include a larger array of multiple ferroelectric capacitor stacks, which may be formed concurrently. In some embodiments, adjacent ferroelectric capacitors, e.g., laterally adjacent ferroelectric capacitors in vertical arrays coupled to and accessed by separate select transistors, are electrically isolated by recessing conductive material between laterally adjacent outer plates and forming an insulator in the recess. Examples of IC devices at various stages of manufacture, e.g., between and during the operations of methods 100 is further illustrated in FIGS. 2A-2G, which show a progression of structures where a memory device is fabricated, e.g., with methods 100.

Methods 100 (FIG. 1) begin at operation 110 with the receipt of a stack of insulating materials and sacrificial materials in interleaved layers. At least portions of the layers of insulating materials will remain as insulators between plates of ferroelectric capacitors in a memory device. The layers of sacrificial materials between the insulators may be replaced by ferroelectric and conductive materials to form the ferroelectric capacitors. As such, there may be an etch selectivity between the insulating and sacrificial materials. In some embodiments, the stack is in an IC die. In some embodiments, the stack is over a device layer having one or more transistors. In some such embodiments, one of the one or more transistors is a select transistor for accessing (e.g., reading from or writing to) information bits stored in the ferroelectric capacitors. In some embodiments, the device layer includes one or more transistors in logic circuitry.

Figure 2A:
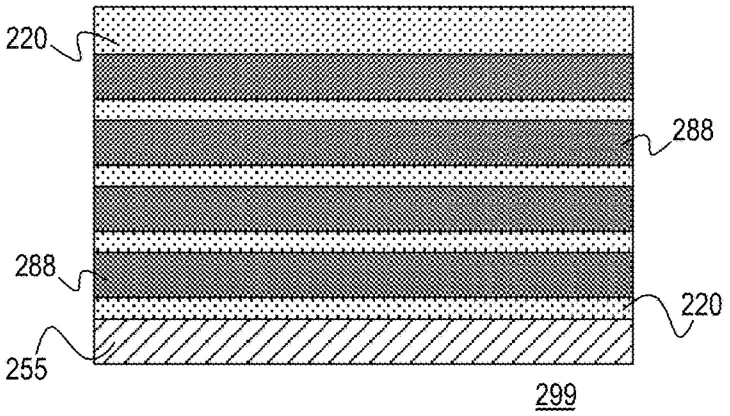
FIGS. 2A, 2B, 2C, 2D, 2E, 2F, and 2G illustrate cross-sectional profile views of a memory device, including an array of ferroelectric capacitors with a stack of outer plates separated by interleaved insulators cantilevered from an inner plate, at various stages of manufacture, in accordance with some embodiments.

FIG. 2A illustrates an interleaved stack of sacrificial layers 288 and insulators 220, e.g., as may be received in operation 110 of methods 100. In the example of FIG. 2A, the stack is in an IC die 299 and over a metallization feature 255, which in some examples is electrically coupled to a source electrode of a select transistor. Although a source or drain may be specified for a terminal, electrode, contact, etc. in some instances, such usage is not limiting in the context of this description. For example, transistors may be substantially symmetric electrically, and either terminal can be used in place of the other in the provided examples.

Any suitable materials may be used for insulators 220 and sacrificial layers 288. Advantageously, materials may be chosen with an etch selectivity between the insulating and sacrificial materials. Additionally, materials may beneficially support subsequent metallization, e.g., damascene, processes. In some embodiments, one or both of insulators 220 and sacrificial layers 288 include inorganic dielectric materials. In some embodiments, one or both of insulators 220 and sacrificial layers 288 include an oxide (e.g., of silicon ($Si_xO_y$), such as $SiO_2$). In some embodiments, one or both of insulators 220 and sacrificial layers 288 include a nitride (e.g., of silicon ($Si_xN_y$), such as $Si_3N_4$). In some embodiments, one or both of insulators 220 and sacrificial layers 288 include oxygen and nitrogen (e.g., silicon oxynitride ($Si_xN_yO_z$), such as $Si_2N_2O$).

Returning to FIG. 1, an opening is formed in the interleaved stack of insulators and sacrificial layers at operation 120. For example, a hole may be etched into the stack, e.g., down through some or all of the layers. Any suitable means may be used to form the opening. In some embodiments, an anisotropic dry etch, such as a reactive-ion etch (RIE), is used. In some embodiments, a deep RIE (DRIE) is used. The opening may have substantially vertical sidewalls. The sidewalls may have a slight taper. In some embodiments, forming the opening exposes a metallization structure coupled to a source or drain contact of an access transistor below the stack. For example, an etch through the stack may form the opening over and down to a source electrode of a select transistor. In some embodiments, multiple holes are etched through the stack. In some such embodiments, the holes each expose corresponding select transistor electrodes. In some embodiments, some holes expose metal lines coupling multiple ferroelectric capacitor arrays storing multiple bits of information.

Figure 2B:
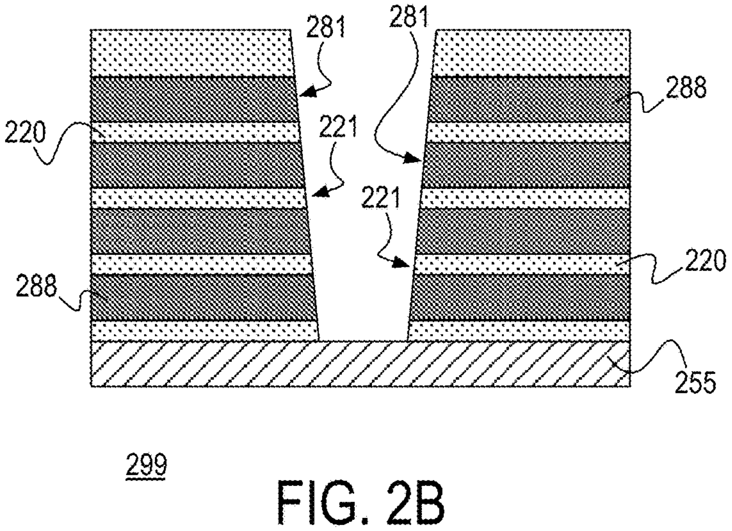

FIG. 2B shows an opening in a stack of sacrificial layers 288 and insulators 220, e.g., as may be etched in operation 120 of methods 100. Sacrificial layers 288 have exposed sidewalls 281, and insulators 220 have exposed sidewalls 221. The opening extends through sacrificial layers 288 and insulators 220 to exposed metallization feature 255.

Returning to FIG. 1, a sidewall of the sacrificial layers is recessed between the insulator layers at operation 130. Recessing the sacrificial material between layers of insulators may develop lateral structures and surfaces of insulating materials in the opening for supporting the insulators on the to-be-formed inner electrode. In some embodiments, a selective isotropic etch retains the insulating material and recesses the sacrificial material laterally between layers of the insulating material. The recessing may be by any suitable means.

Figure 2C:
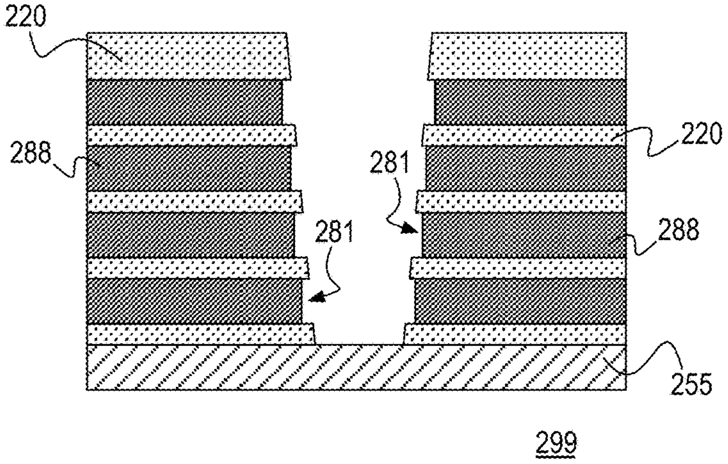
Figure 2C:
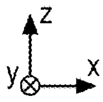

FIG. 2C illustrates an opening with recessed sidewalls 281 in sacrificial layers 288, e.g., as a result of operation 130 of methods 100. Insulators 220 extend into the opening beyond sidewalls 281.

Returning to FIG. 1, an inner plate is formed in the opening at operation 140. The inner plate is formed in contact with the recessed sidewall, e.g., such that the inner plate is under and over the lateral structures and surfaces of insulators extending inward (e.g., previously into the opening and now into the inner plate). The inner plate may be formed by any suitable means. In some embodiments, a damascene or dual-damascene process is used. In some embodiments, a metal is deposited conformally over the insulating and sacrificial materials. In some embodiments, a seed metal is deposited before further metal is formed in the opening over the seed metal. In some embodiments, the inner plate contacts an exposed metallization structure coupled to, e.g., a source terminal of a select transistor for accessing the to-be-formed ferroelectric capacitor array.

Figure 2D:
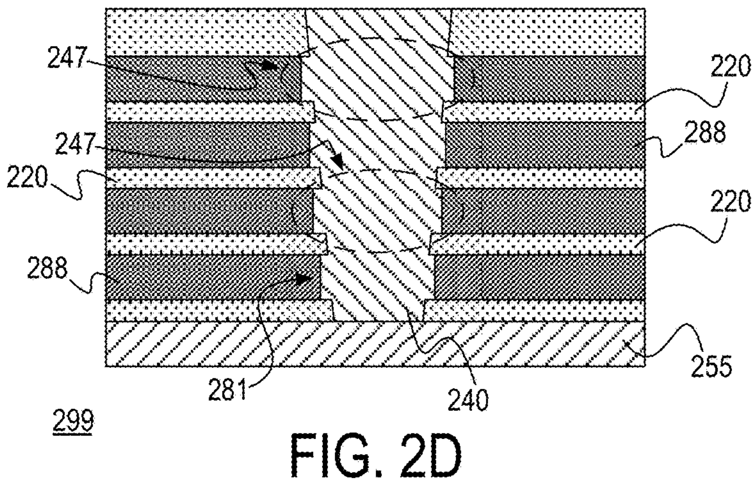

FIG. 2D shows inner plate 240 with wider portions 247 bulging into recesses between (over and under) insulators 220 and contacting recessed sidewalls 281 of sacrificial layers 288, e.g., after an operation 140 of methods 100. Inner plate 240 is coupled to metallization feature 255.

Returning to FIG. 1, a sidewall of the inner plate is exposed by removing the sacrificial layers at operation 150. Removing sacrificial material opens voids between the insulating layers and reveals a sidewall of the inner plate. The sacrificial layers may be removed from the ends of the layers distal the inner plate. The removal may be by any suitable means, e.g., a somewhat selective isotropic etch. A highly selective etch would remove only the sacrificial material and retain, e.g., conductive material of the inner plate. A less-selective etch might remove conductive material of the inner plate along with the sacrificial material, which might reduce or eliminate support of the insulators by the inner plate. The lateral structures and surfaces of insulators extending into the inner plate (e.g., over wider portions of the inner plate) mitigate against the effects of removing some portions of the inner plate.

Figure 2E:
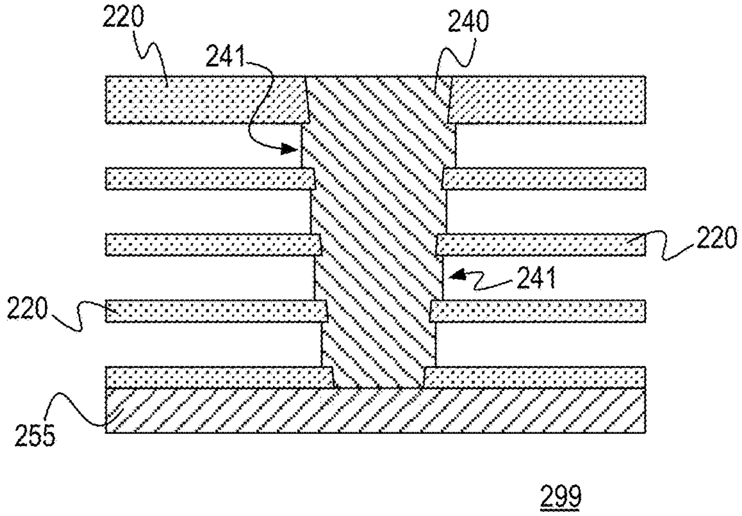

FIG. 2E illustrates insulators 220 extending from, and potentially supported by, inner plate 240 following a removal of sacrificial layers 288, which exposed sidewalls 241 between insulators 220.

Returning to FIG. 1, ferroelectric material is formed on the exposed sidewall of the inner plate at operation 160. Ferroelectric material may be formed by any suitable means. In some embodiments, an atomic layer deposition (ALD) is practiced at operation 160 to conformally deposit ferroelectric material. The ferroelectric material may be any satisfactory (e.g., sufficiently ferroelectric) material with some examples being oxides of hafnium or similar metals, which may have advantages over perovskite materials, such as lead zirconium titanate (PZT, e.g., $PbZr_xTi_{1-x}O_3$). Advantageously, the ferroelectric material may be deposited conformally and to very small thicknesses. For example, the ferroelectric material may be a two-dimensional (2D) material. In some embodiments, the ferroelectric material includes hafnium and oxygen (e.g., $HfO_2$). In some such embodiments, the ferroelectric material includes hafnium, zirconium, and oxygen (HZO) (e.g., hafnium zirconium oxide, $Hf_{1-x}Zr_xO_2$). For such embodiments, an ALD process may enlist a precursor gas including hafnium, hydrogen, carbon, and nitrogen (e.g., $C_{12}H_{32}HfN_4$ or Tetrakis(ethylmethylamino)hafnium(IV) (TEMAH)).

To minimize the unnecessary deposition of ferroelectric material (e.g., over the insulators), FE material may be deposited selectively (e.g., on an exposed sidewall of the inner plate). Advantageously, rather than blanket deposit extraneous ferroelectric material, discrete ferroelectric layers may be deposited selectively, for example, only on an exposed sidewall of the inner plate. Deposition reactants (and, e.g., insulating and inner plate materials) can be chosen to promote deposition selectivity of ferroelectric material between the inner plate and insulating layers. In some embodiments, organic material, e.g., in self-assembling monolayers (SAMs), is used to limit deposition of ferroelectric material to the inner plate. The organic material can be removed after ferroelectric material is deposited in the desired locations. In some embodiments, selective deposition may include selective removal from undesired locations. For example, ferroelectric material may be deposited, e.g., conformally by ALD, over a large area including insulators, but ferroelectric material is selectively removed, e.g., by an atomic layer etch (ALE), from any surfaces besides the inner plate.

Figure 2F:
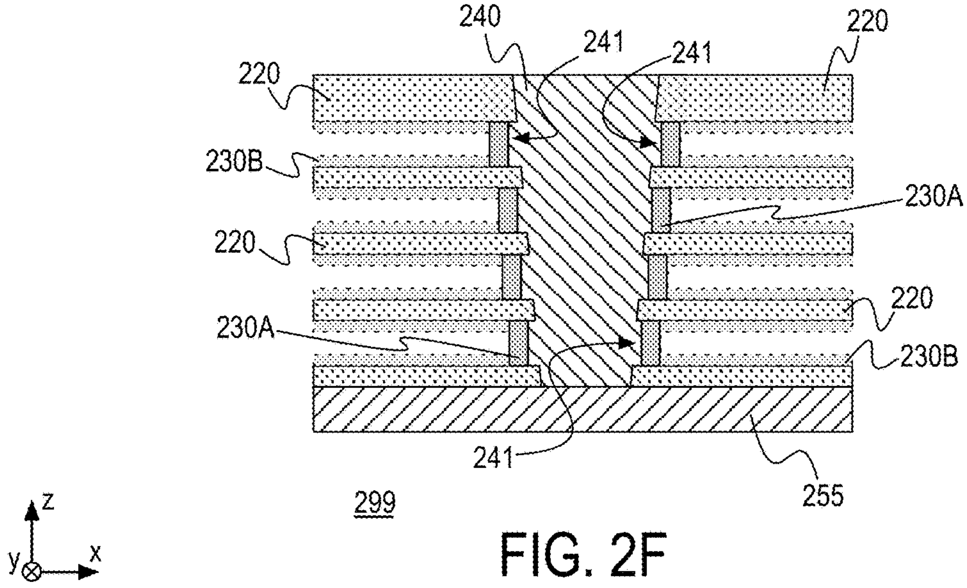

FIG. 2F shows ferroelectric layers 230A, 230B conformally covering insulators 220 and sidewalls 241 of inner plate 240, e.g., after an operation 160 of methods 100. In some embodiments, ferroelectric layers 230A, 230B are deposited over sidewalls 241 and insulators 220, respectively. In some embodiments, only ferroelectric layers 230A are deposited, e.g., selectively, over sidewalls 241 of inner plate 240. In such embodiments, no ferroelectric layers 230B are over insulators 220. The use of suitable materials, e.g., 2D materials, may allow for very thin layers of ferroelectric material between outer plates 210 and inner plate 240. Thinner ferroelectric layers allow for smaller, more compact structures. Smaller structures may enable increased storage densities. In some embodiments, ferroelectric layers 230 have thicknesses of only a few nanometers.

Returning to FIG. 1, a group of outer plates is formed over the ferroelectric material at operation 170, which forms a group of ferroelectric capacitors with a layer of ferroelectric material between the inner plate and each of the outer plates. Any suitable means or materials may be used in the implementation of operation 170. For example, a conductive material may be deposited conformally over the ferroelectric material to form outer plates. Certain dimensions are used, e.g., for illustrating insulators, but shorter insulator lengths may be used, for example, to reduce the amount of ferroelectric material deposited horizontally on the insulators. Limiting the insulator lengths may also limit the outer diameters of the ferroelectric layers and, in some embodiments, the outer plates.

The stack of ferroelectric capacitors may be part of a larger array of multiple ferroelectric capacitor stacks, which may be formed concurrently. Outer plates of laterally adjacent ferroelectric capacitors may be formed concurrently and may electrically connect ferroelectric capacitors in separate capacitor stacks. In some embodiments, laterally adjacent ferroelectric capacitors, e.g., in vertical arrays coupled to separate select transistors, are electrically isolated from each other by recessing conductive material between laterally adjacent outer plates and forming an insulator in the recess. Other laterally adjacent outer plates may remain electrically connected, e.g., by a common plateline.

Figure 2G:
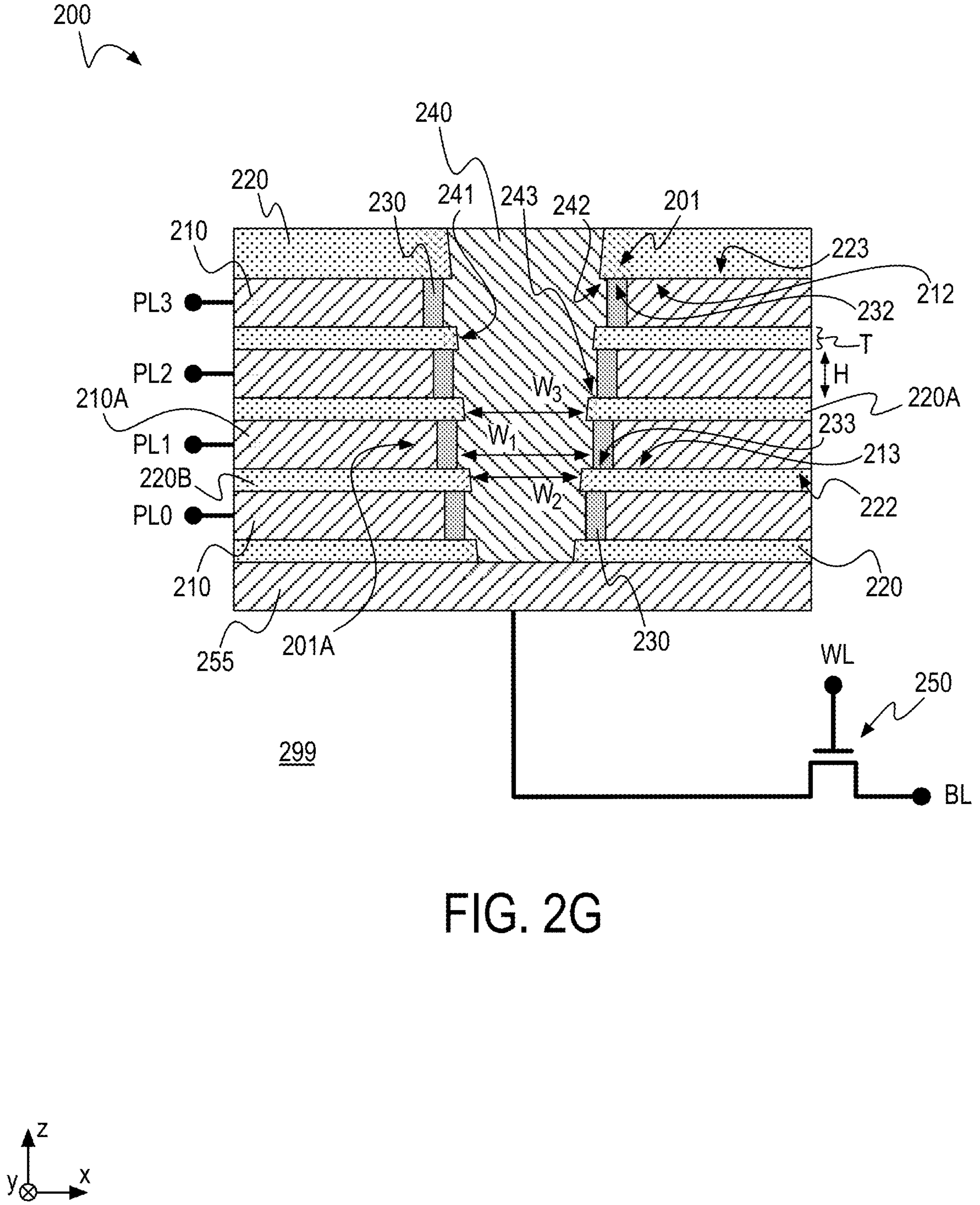

FIG. 2G illustrates memory device 200 in IC die 299 having multiple ferroelectric capacitors 201 with multiple outer plates 210 stacked one above another and surrounding a shared inner plate 240, e.g., following the operations of methods 100. In some embodiments, memory device 200 is formed by a process that differs from one shown in the examples of FIGS. 2A-2F. A group of ferroelectric layers 230 are between the coaxial plates 210, 240. Only substantially vertical ferroelectric layers 230 are present in the example of FIG. 2G (e.g., like ferroelectric layers 230A on sidewalls 241 of inner plate 240 in FIG. 2F). In some embodiments, ferroelectric layers 230 are also over insulators 220 (e.g., like ferroelectric layers 230B in FIG. 2F). Insulators 220 are between vertically adjacent outer plates 210. Ferroelectric capacitors 201 are coupled by inner plate 240 to select transistor 250 through metallization feature 255. The group of outer plates 210 are each coupled to a corresponding plateline PL0-PL3.

The structure of inner plate 240, e.g., its shape, provides support to insulators 220. Inner plate 240 extends substantially vertically through outer plates 210 and insulators 220 with wider portions of inner plate 240 within ferroelectric capacitors 201 and narrower portions between ferroelectric capacitors 201. This can be seen with widths $W_1$, $W_2$, and $W_3$ of corresponding portions of inner plate 240 in memory device 200. A first width $W_1$ of a first portion of inner plate 240 is within outer plate 210A in ferroelectric capacitor 201A. A second width $W_2$ of a second portion of inner plate 240 is within insulator 220B below outer plate 210A. A third width $W_3$ of a third portion of the inner plate 240 is within insulator 220A above outer plate 210A. Width $W_1$ within outer plate 210A and ferroelectric capacitor 201A is greater than both $W_2$ and $W_3$ below and above ferroelectric capacitor 201A.

Ferroelectric layers 230 are aligned between corresponding outer plates 210 and wider portions of inner plate 240. Bottom surfaces 243 of wider portions of inner plate 240 within ferroelectric capacitors 201 and bottom surfaces 233 (or bottom edges) of ferroelectric layers 230 adjoin top surfaces 222 of insulator 220 below the corresponding ferroelectric capacitors 201. Top surfaces 242 of wider portions of inner plate 240 within ferroelectric capacitors 201 and top surfaces 232 (or top edges) of ferroelectric layers 230 adjoin bottom surfaces 223 of insulator 220 above the corresponding ferroelectric capacitors 201. Top surfaces 212 of outer plates 210 are aligned (e.g., substantially coplanar) with top surfaces 232 (or top edges) of corresponding ferroelectric layers 230 within ferroelectric capacitors 201. Bottom surfaces 213 of outer plates 210 are aligned (e.g., substantially coplanar) with bottom surfaces 233 (or bottom edges) of corresponding ferroelectric layers 230 within ferroelectric capacitors 201. Insulators 220 contact sidewalls 241 of inner plate 240 between vertically adjacent outer plates 210.

Device dimensions, e.g., layer thicknesses, may have significant effects on device operation and performance. For example, ferroelectric capacitor 201 plate area may be determined by, e.g., inner plate 240 widths (e.g., a diameter in the lateral or x and y directions) and heights (e.g., in the vertical or z direction) of outer plates 210. These dimensions will influence the volume of ferroelectric material in each ferroelectric capacitor 201.

In some embodiments, outer plates 210 have a height H in the z direction of 100 nm. Such a height may allow for a compact stack of ferroelectric capacitors 201. In some embodiments, outer plates 210 have heights H of 150 nm, which may allow for a larger plate area of ferroelectric capacitors 201 and volume of ferroelectric layers 230. In some embodiments, outer plates 210 have heights H of 125 nm, which may strike an advantageous balance between sufficient ferroelectric material volume and compact memory array size.

In some embodiments, insulators 220 have a thickness T of 15 nm, which may allow for a compact stack of ferroelectric capacitors 201. In some embodiments, insulators 220 have a thickness T of 50 nm, which may provide superior electrical isolation between vertically adjacent outer plates 210 and platelines. In some embodiments, insulators 220 have a thickness T of 25 nm, which may strike an advantageous balance between electrical isolation and compact memory array size.

Thinner ferroelectric layers (and correspondingly closer capacitor plates) allow for greater electric field strengths for the same voltage levels. In some embodiments, ferroelectric layers 230 have a thickness of only 4 nm. Thicker ferroelectric layers 230 can include larger volumes of ferroelectric material, which corresponds to more ferroelectric dipoles in the ferroelectric layers and a correspondingly larger (and more easily detected) current pulse when reading an information bit from a ferroelectric capacitor. In some embodiments, ferroelectric layers 230 have a thickness of 10 nm.

In the examples shown in, e.g., FIGS. 2A-2G and below, ferroelectric layer 230 may include a material in a ferroelectric phase (orthorhombic, non-centrosymmetric crystallinity), which may be exhibited by a higher relative permittivity. For example, a high-k dielectric including predominantly hafnium and oxygen ($HfO_x$), but not in a ferroelectric phase, may have a relative permittivity in the range of 10-14. However, hafnium oxide in a ferroelectric phase may have a relative permittivity exceeding 25 (e.g., 30). Although in both instances the $HfO_x$ includes predominantly hafnium and oxygen, ferroelectric layer 230 advantageously includes a ferroelectric phase of a material, e.g., hafnium oxide. In the case of hafnium oxide (and other pertinent metal oxides, as described below), such phases may be achieved, for example, through the addition of a dopant, such as niobium, titanium, silicon, germanium, aluminum, yttrium, etc.

Many ferroelectric materials are suitable for use in ferroelectric layer 230. As used herein, the term ferroelectric material indicates a material that has a spontaneous electric polarization that may be controlled by the application of an external electric field. Ferroelectric materials exhibit a hysteresis such that when a positive voltage is applied, a positive residual charge is maintained even as the voltage falls to zero. This residual charge is characterized as polarization. To remove the polarization, a negative voltage must be applied. Furthermore, the negative voltage may be used to provide a negative polarization, which is also maintained as the voltage again goes to zero. In ferroelectric capacitors 201 discussed herein, a differential voltage must be applied across ferroelectric capacitor plates 210, 240 to polarize the ferroelectric material (e.g., ferroelectric layer 230) either positively or negatively. This positive or negative polarity may then be read as 1 or 0. Besides the advantage of higher relative permittivity, ferroelectric materials and this polarization have this non-volatility advantage over non-ferroelectric dielectric materials.

Any suitable ferroelectric material may be used. In some embodiments, ferroelectric layers 230 include materials having perovskite structures, e.g., PZT. Perovskite materials have the general formula $ABX_3$ and may be in a structure deviated from a cubic structure. While both A and B are positively charged ions, they may be of different sizes with the A atoms generally larger than the B atoms. The X is a negatively charged ion (frequently an oxide) that bonds to both A and B cations. These perovskite structures can include compounds where the A and/or B sites include multiple materials (e.g., $A1_{x-1}A2_x$ and/or $B1_{y-1}B2_y$). The X site may deviate from, e.g., a cubic coordination configuration as ions within the A and B sites undergo changes in their oxidation states. In some embodiments, ferroelectric layers 230 include materials other than PZT but with perovskite structures.

Advantageously, ferroelectric layer 230 includes a ferroelectric material that may be deposited conformally and to very narrow thicknesses, such as a 2D material. In some embodiments, ferroelectric layer 230 includes hafnium, zirconium, and oxygen (HZO) (e.g., hafnium zirconium oxide, $Hf_{1-x}Zr_xO_2$). In some such embodiments, ferroelectric layer 230 includes dopants, e.g., titanium or niobium. In some embodiments, ferroelectric layer 230 includes hafnium, titanium, and oxygen (e.g., hafnium titanium oxide, $Hf_{1-x}Ti_xO_2$). In some embodiments, ferroelectric layer 230 includes hafnium, scandium, and oxygen. In some embodiments, ferroelectric layer 230 includes zirconium and oxygen (e.g., zirconium dioxide, $ZrO_2$) In some embodiments, ferroelectric layer 230 includes niobium and oxygen. Although, e.g., hafnium zirconium oxide or doped $HfO_x$ or $ZrO_x$ are exemplary embodiments that can be advantageously conformally deposited by ALD, ferroelectric layer 230 may also have other compositions similarly amenable to being deposited at temperatures compatible with, e.g., back-end-of-line (BEOL) structures and with similar thickness conformality. Other ferroelectric materials may be employed.

Select transistor 250 controls access to memory device 200 by electrically connecting (or not) inner plate 240 to, e.g., a bitline BL connected at a drain contact on the electrically opposite end of select transistor 250. Metallization feature 255 is coupled to the source terminal of select transistor 250, and when select transistor 250 conducts, inner plate 240 on metallization feature 255 is electrically connected to bitline BL on the drain terminal. The conduction of select transistor 250 is controlled by the voltage signal applied to gate electrode, e.g., by a wordline WL. Since inner plate 240 is a shared plate for all ferroelectric capacitors 201 in device 200, any bit stored in any of the group's ferroelectric capacitors 201 is accessible by the single select transistor 250.

With select transistor 250 accessing the entire memory array of ferroelectric capacitors 201 via inner plate 240, individual control of ferroelectric capacitors 201 is by controlling outer plates 210 using platelines PL0-PL3 in concert with select transistor 250 using wordline WL. With select transistor 250 conducting, an individual bit corresponding to one of ferroelectric capacitors 201 can be read (or written) by applying a voltage differential across that ferroelectric capacitor 201 (and only that ferroelectric capacitor 201) by applying the same voltage level on inner plate 240 and all the platelines but for the plateline connected to the outer plate 210 corresponding to the ferroelectric capacitor 201 to be read (or written). In this way, a voltage can be applied across inner plate 240 and an individual outer plate 210 to write to or read from only that ferroelectric capacitor 201. Control of storage ferroelectric capacitors 201 may vary with memory scheme used, e.g., control and signal routing.

Outer plates 210 and inner plate 240 may be of any suitably conductive and conveniently processed material, for example, various metals. In some embodiments, one or more of plates 210, 240 include copper. Outer plates 210 and inner plate 240 may have the same or differing compositions. In some embodiments, one or more of plates 210, 240 include ruthenium, molybdenum, tungsten, or nitrogen with one or both titanium or tantalum (e.g., TiN or TaN). Outer plates 210 may also have the same or a different composition than associated platelines.

Figure 3:
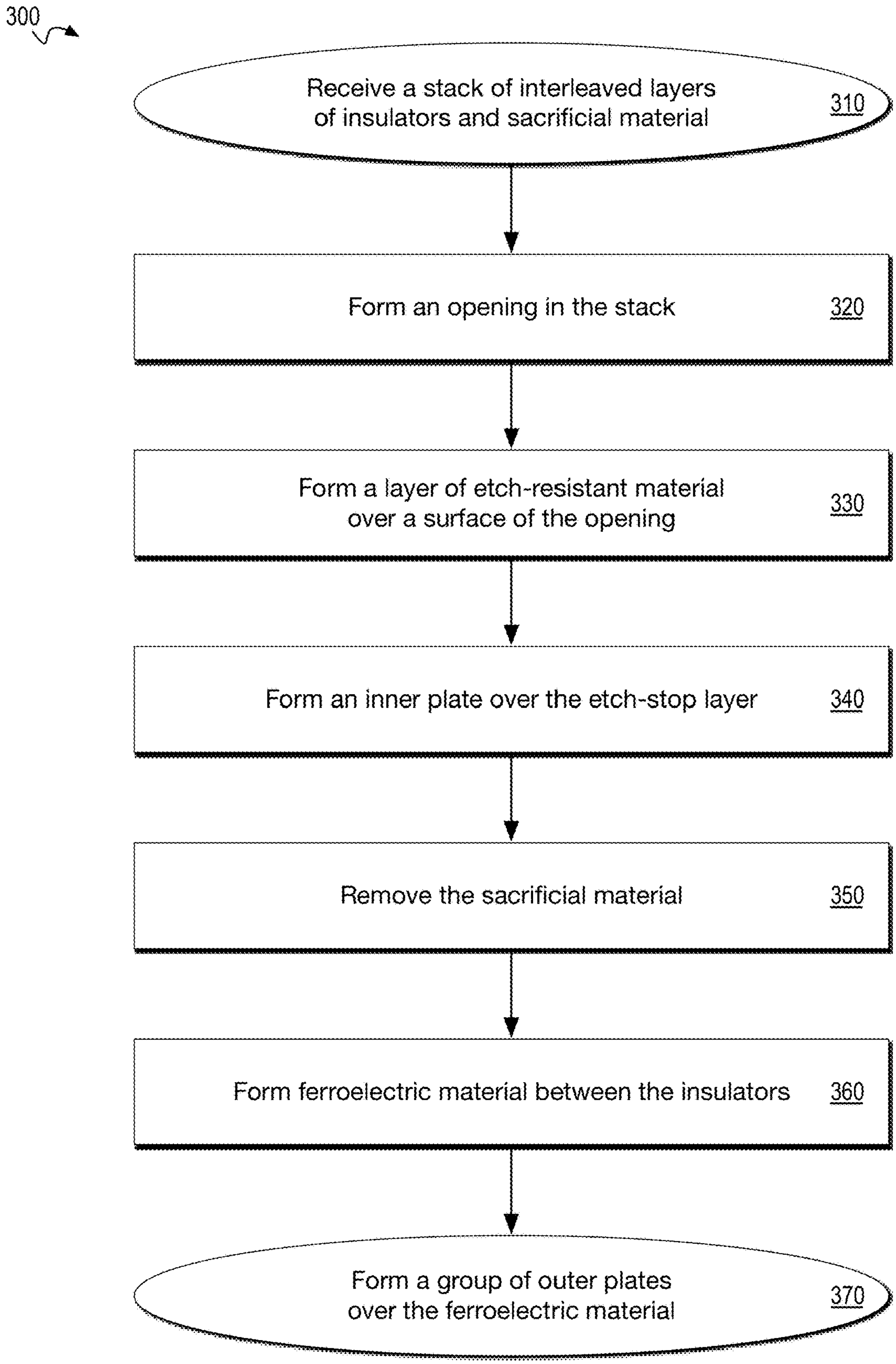
FIG. 3 is a flow chart of methods for forming a memory device, including forming an array of ferroelectric capacitors with multiple outer plates around a shared inner plate, in accordance with some embodiments.

FIG. 3 is a flow chart of methods for forming a memory device, including forming an array of ferroelectric capacitors with multiple outer plates around a shared inner plate, in accordance with some embodiments. Methods 300 include operations 310-370. Some operations of methods 300 have similarities with operations of methods 100, which may be referenced. Some operations shown in FIG. 3 are optional. FIG. 3 shows an example sequence, but the operations can be done in other orders as well, and some operations may be omitted. Some operations can also be performed multiple times before other operations are performed. Some operations may be included within other operations.

Methods 300 generally entail forming a layer of etch-resistant material within an opening in an interleaved stack of insulating and sacrificial layers. Subsequent removal of the sacrificial material then exposes the etch-resistant material, preventing release of the insulators so that outer plates can then be formed over the ferroelectric material. In some embodiments, the ferroelectric material formed between the insulators is formed over the etch-resistant material. In some such embodiments, the etch-resistant material includes a conductive material. In other embodiments, the etch-resistant material is removed from between the insulators so that the ferroelectric material formed between the insulators directly contacts the inner plate. The etch-resistant material may be retained as an interface layer, e.g., between the insulators and the inner plate.

FIGS. 4A-4J illustrate cross-sectional profile views of a memory device at various stages of manufacture, in accordance with some embodiments, e.g., with methods 300.

Returning to FIG. 3, methods 300 begin at operation 310 with the receipt of a stack of insulating materials and sacrificial materials in interleaved layers. The stack may be similar or the same as the stacks described in FIG. 2A and in operation 110 of methods 100 in FIG. 1, and the examples described there may also serve as examples for operation 310 of methods 300. However, some differences between the methods may allow for differences between the stacks. For example, an etch-resistant material may be used to form an etch-stop layer in methods 300, which may enable the use of different chemistries, e.g., different materials for the sacrificial layers in the interleaved stack.

Figure 4A:
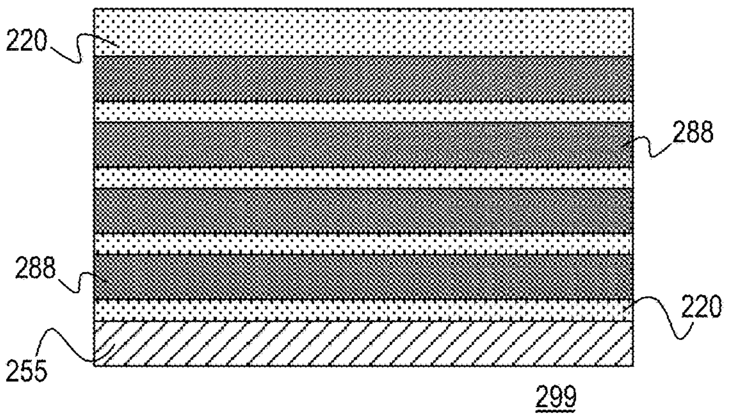

FIG. 4A illustrates an interleaved stack of sacrificial layers 288 and insulators 220, e.g., as may be received in operation 310 of methods 300. In the example of FIG. 4A, the stack is in an IC die 299 and over a metallization feature 255, which in some examples is electrically coupled to a source electrode of a select transistor. As discussed, previous examples of the interleaved stack, e.g., described in FIG. 2A, may serve as examples in FIG. 4A (and other figures).

Returning to FIG. 3, an opening is formed in the interleaved stack of insulators and sacrificial layers at operation 320. Any suitable means may be used to form the opening. As the interleaved stack may be similar to previous examples, the method(s) used to form an opening in the stack may be similar as well. For example, a DRIE, etc., may be used. In some embodiments, forming the opening exposes a metallization structure coupled to a source or drain contact of a select transistor below the stack.

Figure 4B:
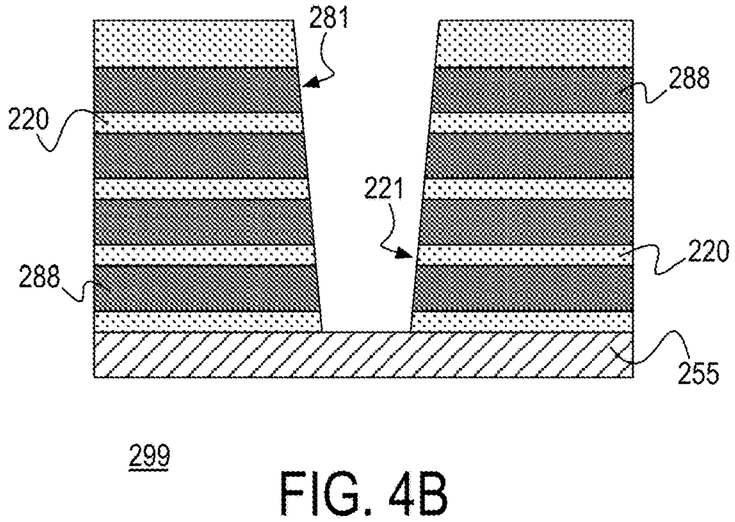

FIG. 4B shows an opening in a stack of sacrificial layers 288 and insulators 220, e.g., as may be etched in operation 320 of methods 300. Sacrificial layers 288 have exposed sidewalls 281, and insulators 220 have exposed sidewalls 221. The opening extends through sacrificial layers 288 and insulators 220 to exposed metallization feature 255.

Returning to FIG. 3, an etch-stop layer is formed over a sidewall of the opening at operation 330. The etch-stop layer may be formed by any suitable means. In some embodiments, a layer of etch-resistant material is deposited, e.g., conformally by an ALD or chemical vapor deposition (CVD), over all exposed surfaces in the opening, including exposed sidewalls of the sacrificial layers. The etch-resistant material may be selected such that there is an etch selectivity between the sacrificial material and etch-resistant material. The etch-resistant material may be retained to protect the to-be-formed inner plate when the sacrificial material is selectively removed. After the sacrificial material is removed, the etch-resistant material may act as an interface layer between the inner plate and the insulators. The interface layer may provide structural support for the insulators by coupling the inner plate and the insulators. In some embodiments, the etch-resistant material is deposited over a bottom surface of the opening. In some such embodiments, the etch-resistant material is removed from the bottom surface of the opening, for example with an unmasked anisotropic "spacer" etch, prior to operation 340. In other embodiments, the etch-resistant material is retained as an interface layer on the bottom surface of the opening.

Figure 4C:
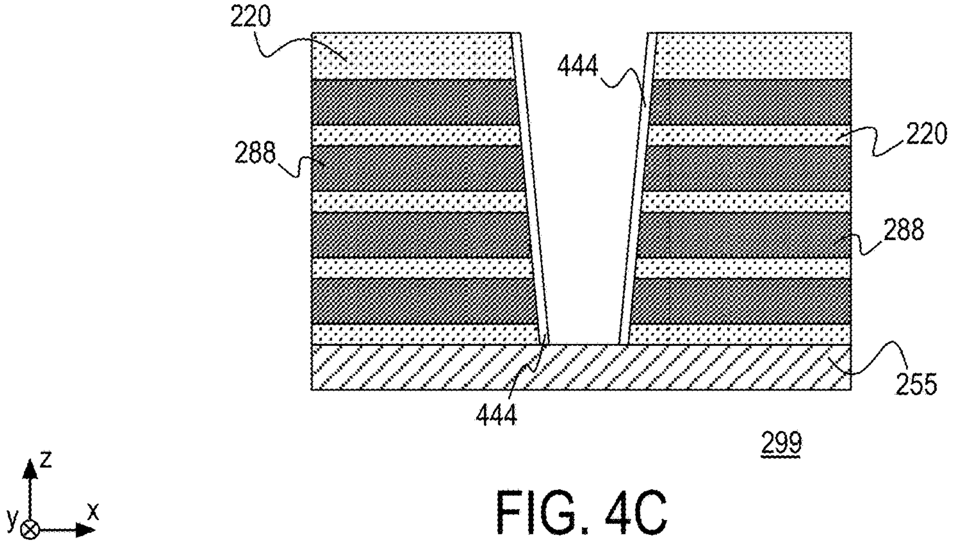

FIG. 4C illustrates an opening with an interface layer 444 of etch-resistant material conformally covering at least some surfaces of the opening, including sidewalls 281 in sacrificial layers 288, e.g., as a result of operation 330 of methods 300. In some embodiments, interface layer 444 covers the bottom surface of the opening, e.g., metallization feature 255. In some such embodiments, interface layer 444 includes a conductive material.

Interface layer 444 includes etch-resistant material over at least insulators 220 and sacrificial layers 288. In some embodiments, interface layer 444 may beneficially act as electrical insulation between structures. As such, interface layers 444 may include an insulating etch-resistant material, such as a dielectric material. In some embodiments, interface layers 444 include an oxide (e.g., of silicon ($Si_xO_y$), such as $SiO_2$, or of aluminum ($Al_xO_y$), such as $Al_2O_3$). In some embodiments, interface layers 444 include a nitride (e.g., of silicon ($Si_xN_y$), such as $Si_3N_4$). In some embodiments, interface layers 444 include oxygen and nitrogen (e.g., silicon oxynitride ($Si_xN_yO_z$), such as $Si_2N_2O$).

In other embodiments, interface layer 444 includes a conductive material, such as a metal, and may be thought of as an outer layer of inner plate 240. In some embodiments, interface layer 444 includes copper. In some embodiments, interface layer 444 may include ruthenium, molybdenum, tungsten, or nitrogen with one or both titanium or tantalum (e.g., TiN or TaN). Interface layers 444 may also have other compositions.

Returning to FIG. 3, an inner plate is formed over at least the etch-stop layer at operation 340. The inner plate is formed in the opening, e.g., with the etch-stop layer between the inner plate and the insulators, and with the etch-stop layer between the inner plate and the sacrificial materials. In some embodiments, the inner plate entirely fills the opening.

FIG. 4D shows inner plate 240 with interface layer 444 between inner plate 240 and insulators 220, and with interface layer 444 between inner plate 240 and sacrificial layers 288. In some embodiments, interface layer 444 can be considered integrated with inner plate 240, e.g., when interface layer 444 includes a conductive material. In some embodiments, interface layer 444 can be considered a protective layer over inner plate 240, e.g., when interface layer 444 includes a non-conductive, etch-resistant material.

Returning to FIG. 3, a sidewall of the etch-stop layer is exposed by removing the sacrificial layers at operation 350. Removing sacrificial material opens voids between the insulating layers and reveals the etch-stop layer, which covers the inner plate. The removal may be by any suitable means, e.g., a selective isotropic etch. Advantageously, the composition of the etch-stop layer is chosen such that a removal etch is highly selective to the sacrificial material and retains the etch-stop layer over the inner plate and the insulators.

Removing the sacrificial material enables exposing a sidewall of the inner plate. In some embodiments, the etch-stop (interface) layer is removed between the insulator layers, e.g., with an isotropic etch selective to the etch-stop layer. In some embodiments, a less-selective etch is used, but sufficient etch-resistant material is retained, e.g., as an interface between the insulators and inner plate, while the etch-resistant material is removed between the insulator layers. The etch-stop layer may be removed, e.g., to allow ferroelectric material to be deposited directly on the inner plate.

FIG. 4E illustrates insulators 220 coupled to interface layer 444 and supported by inner plate 240, e.g., following operation 350 of methods 300. There are no sacrificial layers 288, and interface layer 444 is exposed between insulators 220.

Figure 4F:
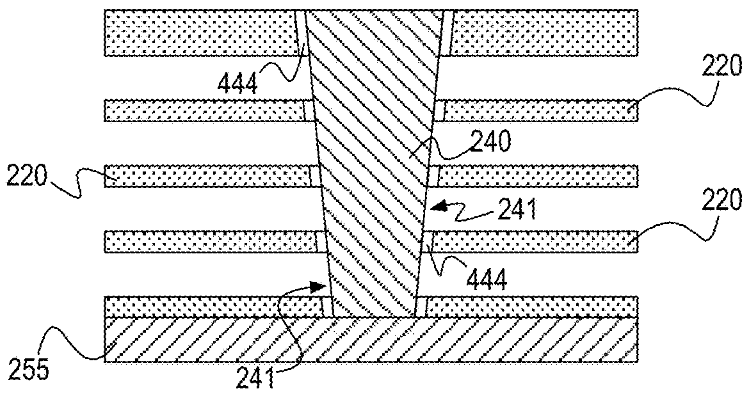

FIG. 4F shows insulators 220 coupled to separate interface layers 444 and supported by inner plate 240. There are no sacrificial layers 288, and inner plate 240 has exposed sidewalls 241 between the separate interface layers 444 (and insulators 220).

Returning to FIG. 3, ferroelectric material is formed between the insulator layers at operation 360. The forming may be by any suitable means, e.g., a conformal deposition. In some embodiments, an ALD is used. Advantageously, the ferroelectric material may be a material capable of very thin deposition, such as a 2D material (e.g., HZO or doped $HfO_2$). In some embodiments, the deposition uses a precursor gas including hafnium, hydrogen, carbon, and nitrogen (e.g., TEMAH).

In some embodiments, ferroelectric material is deposited on an exposed sidewall of the inner plate between the insulator layers, e.g., after both the sacrificial and etch-resistant materials are removed between the insulator layers. In some embodiments, ferroelectric material is deposited over the interface layer, which has been retained between the insulator layers. In some such embodiments, the interface layer includes a conductive material.

Figure 4G:
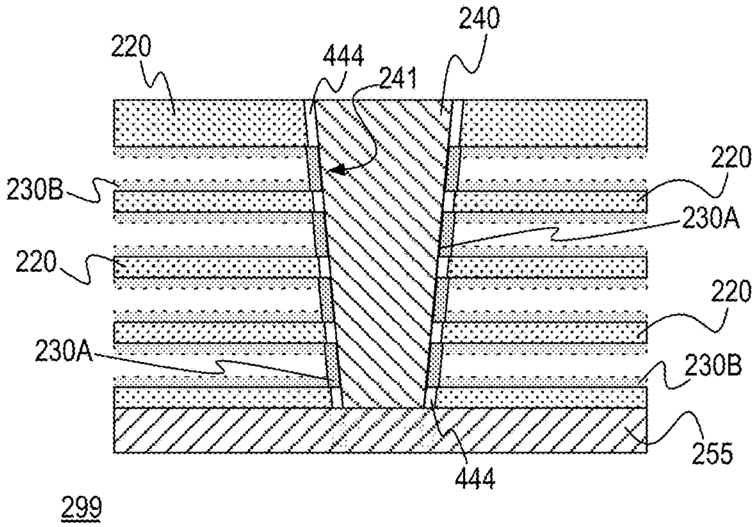

FIG. 4G illustrates ferroelectric layers 230A, 230B conformally covering insulators 220 and sidewalls 241 of inner plate 240, e.g., after an operation 360 of methods 300. In some embodiments, ferroelectric layers 230A, 230B are deposited over sidewalls 241 and insulators 220, respectively. In some embodiments, only ferroelectric layers 230A are deposited, e.g., selectively, over sidewalls 241 of inner plate 240. In such embodiments, no ferroelectric layers 230B are over insulators 220. Sidewalls 241 of inner plate 240 are alternatingly covered by separate interface layers 444 and ferroelectric layers 230A. In some embodiments, ferroelectric layers 230A, 230B have thicknesses of only a few nanometers.

Returning to FIG. 3, a group of outer plates is formed over the ferroelectric material at operation 370, which forms a group of ferroelectric capacitors with a layer of ferroelectric material between the inner plate and each of the outer plates. In some embodiments, etch-resistant material is also between the inner plate and each of the outer plates. In some embodiments, a conductive material is deposited conformally over the ferroelectric material to form outer plates. In some embodiments, outer plates are over only a thin, substantially vertical layer of ferroelectric material over the inner plate (and, in some embodiments, the interface layer). In some embodiments, ferroelectric layers are also over insulators, and outer plates are formed over the FE layers such that FE material is between the outer plates and the inner plate, as well as between the outer plates and the insulators.

In some embodiments, adjacent stacks of ferroelectric capacitors are electrically isolated by etching down conductive material, e.g., of outer plates, between the stacks and forming insulating material in the trench left between the adjacent stacks.

Figure 4H:
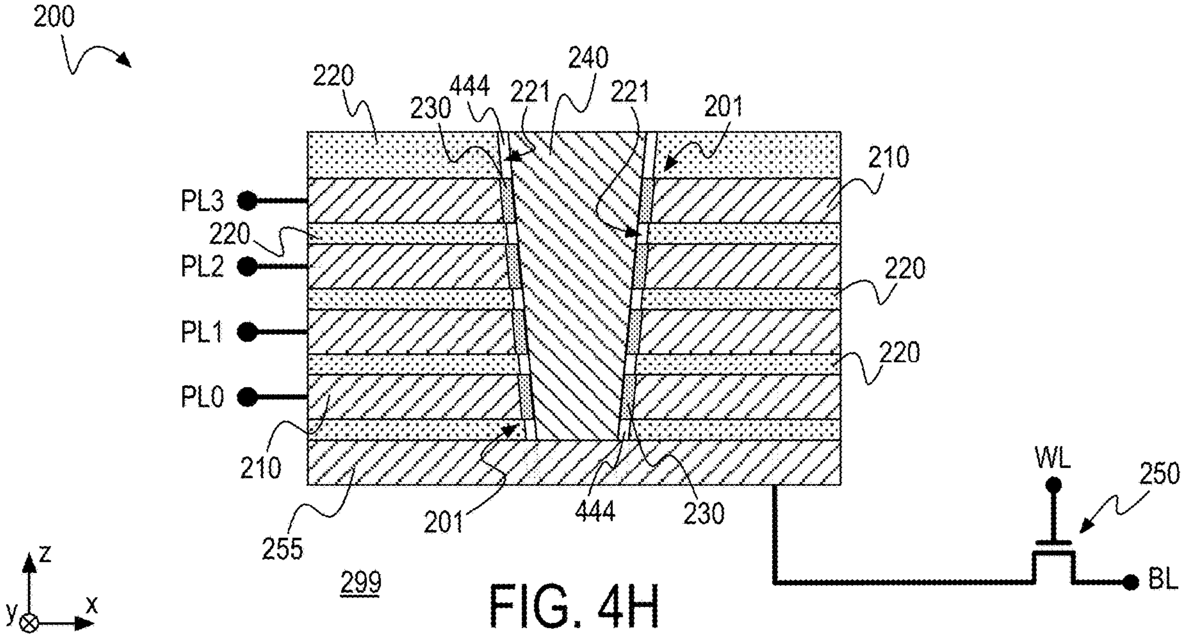

FIG. 4H shows memory device 200 in IC die 299 having multiple ferroelectric capacitors 201 with a shared inner plate 240 extending through multiple outer plates 210 stacked one above another, e.g., following the operations of methods 300. The group of ferroelectric capacitors 201 include a group of ferroelectric layers 230 between the coaxial plates 210, 240. Only substantially vertical ferroelectric layers 230 are present in the example of FIG. 4H (e.g., like ferroelectric layers 230A on sidewalls 241 of inner plate 240 in FIG. 4G). In some embodiments, ferroelectric layers 230 are also over insulators 220 (e.g., like ferroelectric layers 230B in FIG. 4G). Insulators 220 are interleaved between vertically adjacent outer plates 210, and interface layers 444 are laterally between inner plate 240 and insulators 220. Interface layers 444 are between vertically adjacent ferroelectric layers 230. Ferroelectric capacitors 201 are coupled by inner plate 240 to select transistor 250 through metallization feature 255. The group of outer plates 210 are each coupled to a corresponding plateline PL0-PL3.

Memory device 200 in the example of FIG. 4H may operate similarly and, e.g., have similar dimensions to memory device 200 in the example of FIG. 2G. For example, in some embodiments, ferroelectric layers 230 have a thickness of only 4 nm. In some embodiments, ferroelectric layers 230 have a thickness of 10 nm.

FIG. 4I illustrates ferroelectric layers 230A, 230B conformally covering insulators 220 and interface layer 444, which is between inner plate 240 and ferroelectric layers 230A. The example of FIG. 4I may follow the example of FIG. 4E after ferroelectric material is formed between insulators 220 and over interface layer 444 at operation 360 of methods 300. In some embodiments, ferroelectric layers 230A, 230B are deposited over interface layer 444 and insulators 220, respectively. In some embodiments, only ferroelectric layers 230A are deposited, e.g., selectively, over interface layer 444. In such embodiments, no ferroelectric layers 230B are over insulators 220.

FIG. 4J shows memory device 200 in IC die 299 having multiple ferroelectric capacitors 201 with a shared inner plate 240 extending through multiple outer plates 210 stacked one above another, e.g., following the operations of methods 300. The group of ferroelectric capacitors 201 include a group of ferroelectric layers 230 between the coaxial plates 210, 240. Only substantially vertical ferroelectric layers 230 are present in the example of FIG. 4J (e.g., like ferroelectric layers 230A on interface layer 444 in FIG. 4I). In some embodiments, ferroelectric layers 230 are also over insulators 220 (e.g., like ferroelectric layers 230B in FIG. 4I). Interface layer 444 is also between the coaxial plates 210, 240. Interface layer 444 is adjacent ferroelectric layers 230 and between inner plate 240 and ferroelectric layers 230. Above and below outer plates 210, interface layer 444 is laterally between inner plate 240 and insulators 220. Insulators 220 are interleaved between vertically adjacent outer plates 210. Insulators 220 are also between vertically adjacent ferroelectric layers 230. Ferroelectric capacitors 201 are coupled by inner plate 240 to select transistor 250 through metallization feature 255. The group of outer plates 210 are each coupled to a corresponding plateline PL0-PL3.

Memory device 200 in the example of FIG. 4J may be similar to memory device 200 in the examples of FIG. 2G or FIG. 4H. For example, in some embodiments, ferroelectric layers 230 have a thickness of only 4 nm. In some embodiments, ferroelectric layers 230 have a thickness of 10 nm.

Figure 5A:
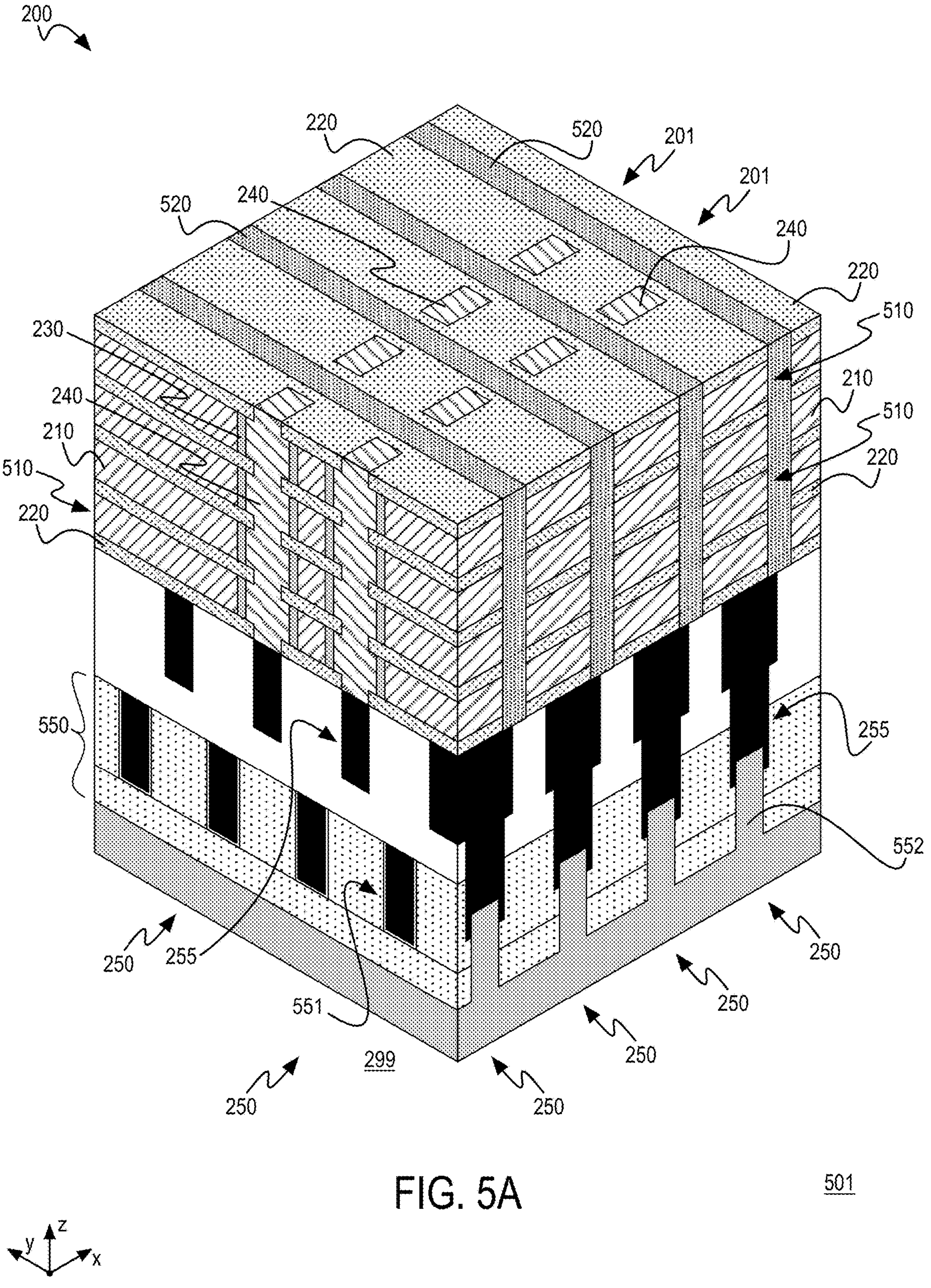
FIGS. 5A, 5B, and 5C illustrate isometric views of memory devices in an integrated circuit die, including multiple stacks of ferroelectric capacitors over a device layer with select transistors, in accordance with some embodiments.
Figure 5B:
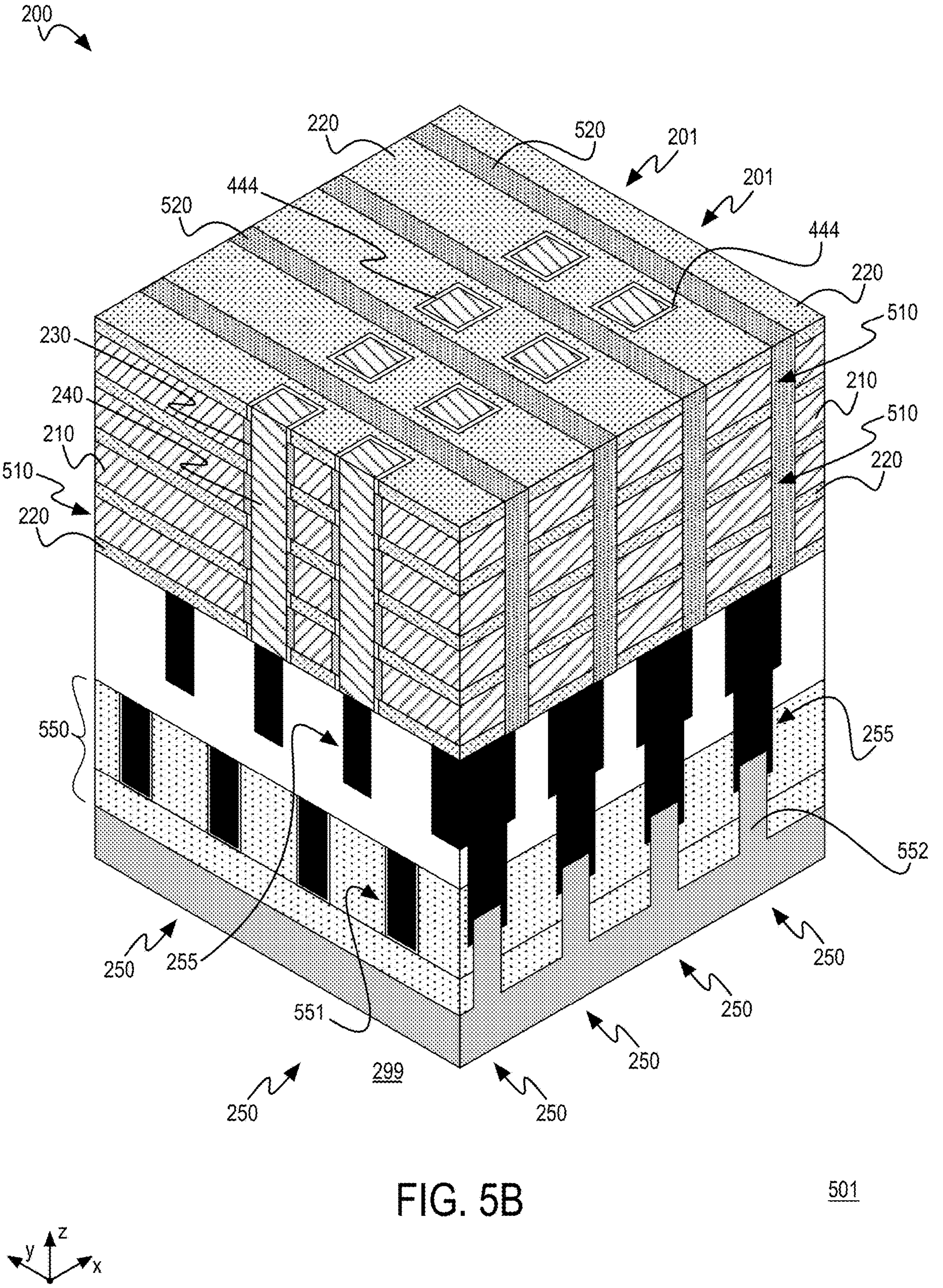
Figure 5C:
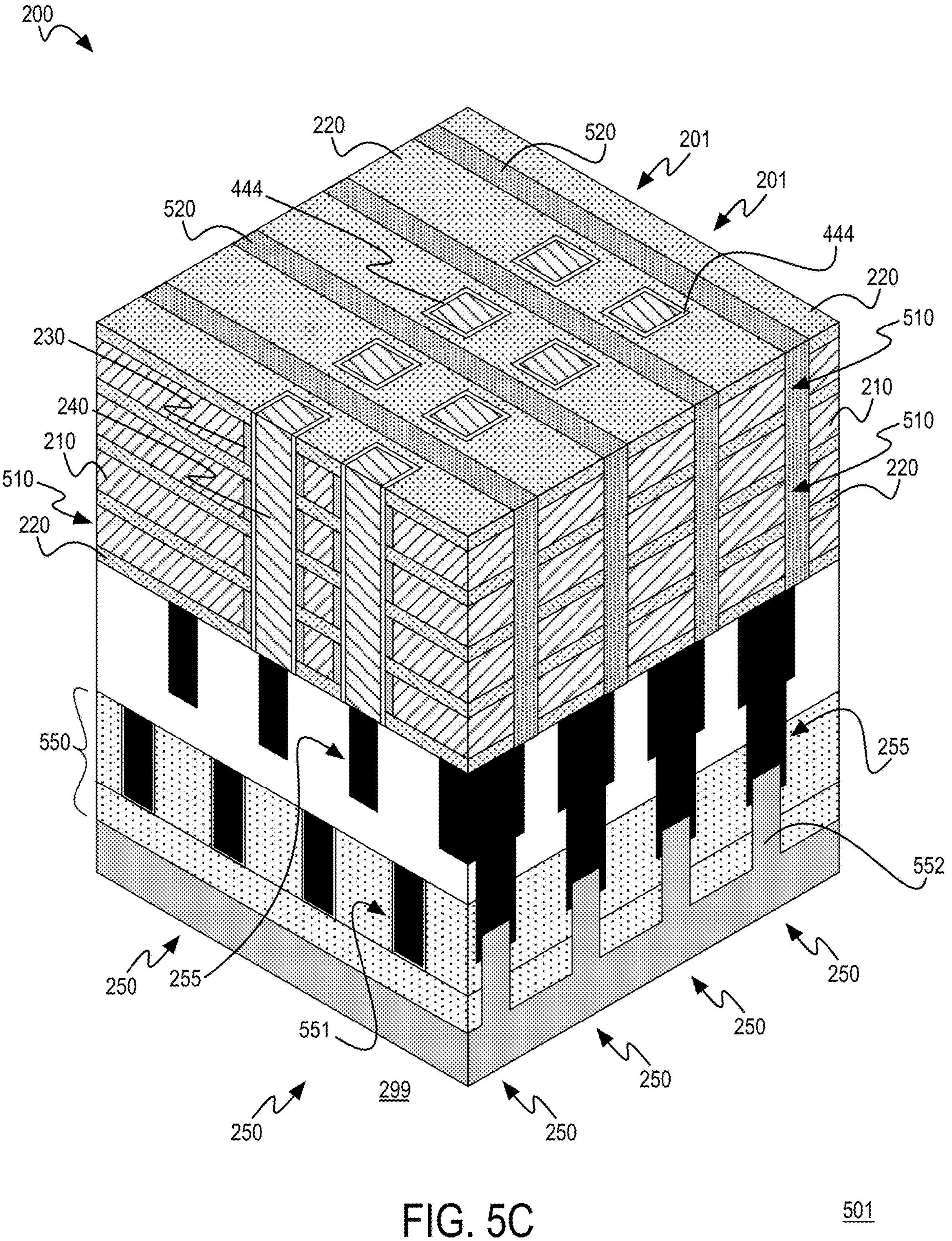

FIGS. 5A, 5B, and 5C illustrate isometric views of memory devices 200 in IC die 299, including multiple stacks of ferroelectric capacitors 201 over a device layer 550 with select transistors 250, in accordance with some embodiments. FIGS. 5A-5C include multiple laterally adjacent stacks of 3D ferroelectric capacitors 201. Stacks of 3D ferroelectric capacitors 201 are coupled at outer plates 210 by platelines 510 extending in the y direction to other stacks of 3D ferroelectric capacitors 201. Outer plates 210 are coupled to (or integrated parts of) platelines 510. Some stacks of 3D ferroelectric capacitors 201 and their associated platelines 510 are electrically isolated from laterally adjacent ferroelectric capacitors 201 (and other platelines 510) by isolators 520 also extending in the y direction.

Transistor device layer 550 includes select transistors 250 with channels 552 and gate structures 551 (having oxide over gate electrodes and between the electrodes and channels 552). In the examples of FIGS. 5A-5C, select transistors 250 are FinFETs and channels 552 are within the fins. Some channels 552 are coupled to inner plates 240 by metallization features 255 on source terminals of select transistors 250. In some embodiments, gate structures 551 of select transistors 250 are each coupled to a separate wordline. In some embodiments, some gate structures 551 are coupled to a same wordline (e.g., for some select transistors 250 and their associated ferroelectric capacitors 201 that are coupled to separate platelines 510). In some embodiments, transistor device layer 550 includes transistors used for logic operations, e.g., processing. In some embodiments, transistor device layer 550 is above or below a layer with transistors used for logic operations, e.g., processing.

IC die 299 is coupled, and electrically connected, to a system substrate 501. IC die 299 is coupled, and electrically connected, to a power supply through system substrate 501. System substrate 501 may be any host component, such as a package substrate or interposer, another IC die, etc. System substrate 501 may couple to another host component, such as a package substrate or interposer, another IC die, etc. In some embodiments, IC die 299 is coupled, and electrically connected, to system substrate 501 through an intervening host component. System substrate 501 may include a power supply or be coupled to a power supply through another host component.

FIG. 5A shows IC die 299 and memory device 200 with multiple ferroelectric caps 201 having insulators 220 between vertically adjacent outer plates 210, between vertically adjacent ferroelectric layers 230, and between vertically adjacent wider portions of inner plate 240. Platelines 510 extend in the y direction and electrically connect ferroelectric caps 201 in a same row (in the y direction) and at a same height. Isolators 520 extend in the y direction and electrically isolate ferroelectric caps 201 not in a same row (in the y direction). For example, ferroelectric caps 201 at a same height aligned in the x direction (and their respective platelines) are separated by isolators 520 extending in the y direction.

FIG. 5B illustrates IC die 299 and memory device 200 similar to the example of FIG. 5A, but with ferroelectric caps 201 having interface layers 444 between inner plates 240 and insulators 220. Interface layers 444 are also between vertically adjacent ferroelectric layers 230.

FIG. 5C shows IC die 299 and memory device 200 similar to the example of FIG. 5B, but with ferroelectric caps 201 having interface layer 444 between inner plate 240 and ferroelectric layers 230. Interface layer 444 may include a conductive material.

Figure 6:
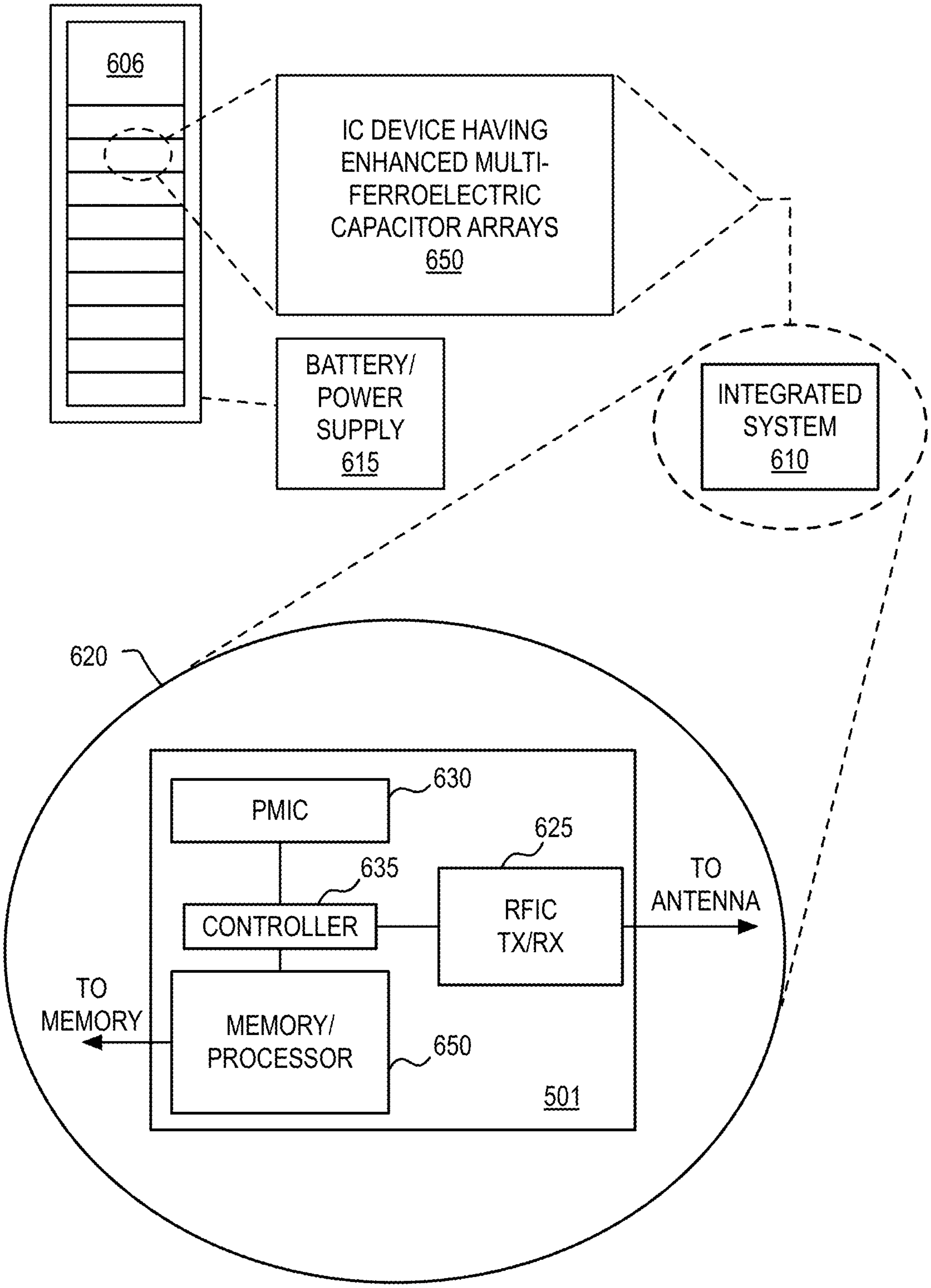
FIG. 6 illustrates a diagram of an example data server machine employing an IC device with memory devices having arrays of ferroelectric capacitors over select transistors, in accordance with some embodiments.

FIG. 6 illustrates a diagram of an example data server machine 606 employing an IC device with memory devices having arrays of ferroelectric capacitors over select transistors, in accordance with some embodiments. Server machine 606 may be any commercial server, for example, including any number of high-performance computing platforms disposed within a rack and networked together for electronic data processing, which in the exemplary embodiment includes one or more devices 650 having multiple-ferroelectric capacitor arrays in improved memory structures.

Also as shown, server machine 606 includes a battery and/or power supply 615 to provide power to devices 650, and to provide, in some embodiments, power delivery functions such as power regulation. Devices 650 may be deployed as part of a package-level integrated system 610. Integrated system 610 is further illustrated in the expanded view 620. In the exemplary embodiment, devices 650 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 650 is a microprocessor including an SRAM cache memory. As shown, device 650 may be an IC device having improved memory structures with multiple-ferroelectric capacitor arrays, as discussed herein. Device 650 may be further coupled to (e.g., communicatively coupled to) a board, an interposer, or a substrate 501 along with, one or more of a power management IC (PMIC) 630, RF (wireless) IC (RFIC) 625 including a wideband RF (wireless) transmitter and/or receiver (TX/RX) (e.g., including a digital baseband and an analog front end module further includes a power amplifier on a transmit path and a low noise amplifier on a receive path), and a controller 635 thereof. In some embodiments, RFIC 625, PMIC 630, controller 635, and device 650 include improved memory structures with multiple-ferroelectric capacitor arrays.

Figure 7:
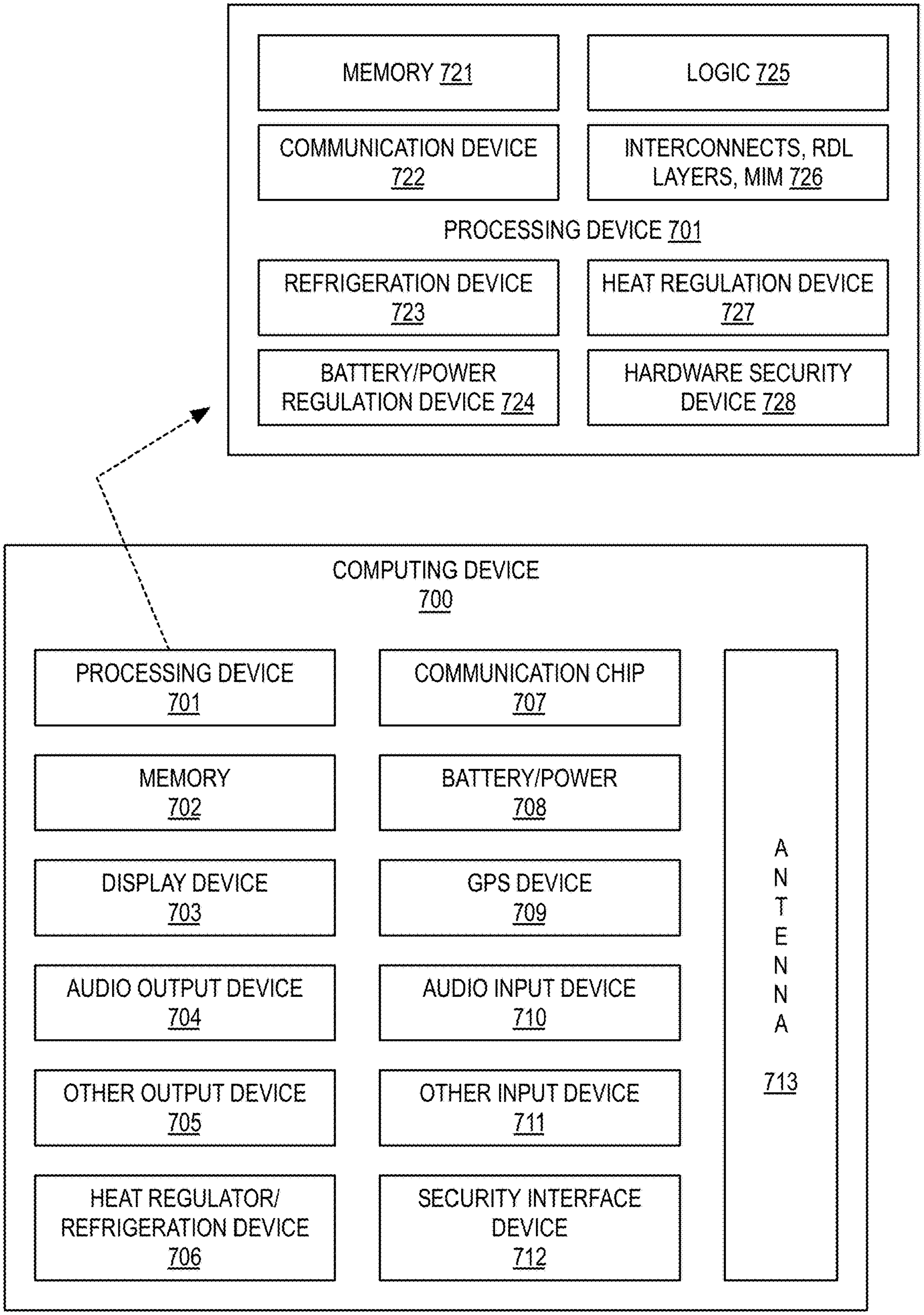
FIG. 7 is a block diagram of an example computing device, in accordance with some embodiments.

FIG. 7 is a block diagram of an example computing device 700, in accordance with some embodiments. For example, one or more components of computing device 700 may include any of the devices or structures discussed herein. A number of components are illustrated in FIG. 7 as being included in computing device 700, but any one or more of these components may be omitted or duplicated, as suitable for the application. In some embodiments, some or all of the components included in computing device 700 may be attached to one or more printed circuit boards (e.g., a motherboard). In some embodiments, various ones of these components may be fabricated onto a single system-on-a-chip (SoC) die. Additionally, in various embodiments, computing device 700 may not include one or more of the components illustrated in FIG. 7, but computing device 700 may include interface circuitry for coupling to the one or more components. For example, computing device 700 may not include a display device 703, but may include display device interface circuitry (e.g., a connector and driver circuitry) to which display device 703 may be coupled. In another set of examples, computing device 700 may not include an audio output device 704, other output device 705, global positioning system (GPS) device 709, audio input device 710, or other input device 711, but may include audio output device interface circuitry, other output device interface circuitry, GPS device interface circuitry, audio input device interface circuitry, audio input device interface circuitry, to which audio output device 704, other output device 705, GPS device 709, audio input device 710, or other input device 711 may be coupled.

Computing device 700 may include a processing device 701 (e.g., one or more processing devices). As used herein, the term "processing device" or "processor" indicates a device that processes electronic data from registers and/or memory to transform that electronic data into other electronic data that may be stored in registers and/or memory. Processing device 701 may include a memory 721, a communication device 722, a refrigeration device 723, a battery/power regulation device 724, logic 725, interconnects 726 (i.e., optionally including redistribution layers (RDL) or metal-insulator-metal (MIM) devices), a heat regulation device 727, and a hardware security device 728.

Processing device 701 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

Computing device 700 may include a memory 702, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 702 includes memory that shares a die with processing device 701. This memory may be used as cache memory and may include embedded dynamic random-access memory (eDRAM) or spin transfer torque magnetic random-access memory (STT-MRAM).

Computing device 700 may include a heat regulation/refrigeration device 706. Heat regulation/refrigeration device 706 may maintain processing device 701 (and/or other components of computing device 700) at a predetermined low temperature during operation.

In some embodiments, computing device 700 may include a communication chip 707 (e.g., one or more communication chips). For example, the communication chip 707 may be configured for managing wireless communications for the transfer of data to and from computing device 700. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 707 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 707 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 707 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 707 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 707 may operate in accordance with other wireless protocols in other embodiments. Computing device 700 may include an antenna 713 to facilitate wireless communications and/or to receive other wireless communications (such as AM or FM radio transmissions).

In some embodiments, communication chip 707 may manage wired communications, such as electrical, optical, or any other suitable communication protocols (e.g., the Ethernet). As noted above, communication chip 707 may include multiple communication chips. For instance, a first communication chip 707 may be dedicated to shorter-range wireless communications such as Wi-Fi or Bluetooth, and a second communication chip 707 may be dedicated to longer-range wireless communications such as GPS, EDGE, GPRS, CDMA, WiMAX, LTE, EV-DO, or others. In some embodiments, a first communication chip 707 may be dedicated to wireless communications, and a second communication chip 707 may be dedicated to wired communications.

Computing device 700 may include battery/power circuitry 708. Battery/power circuitry 708 may include one or more energy storage devices (e.g., batteries or capacitors) and/or circuitry for coupling components of computing device 700 to an energy source separate from computing device 700 (e.g., AC line power).

Computing device 700 may include a display device 703 (or corresponding interface circuitry, as discussed above). Display device 703 may include any visual indicators, such as a heads-up display, a computer monitor, a projector, a touchscreen display, a liquid crystal display (LCD), a light-emitting diode display, or a flat panel display, for example.

Computing device 700 may include an audio output device 704 (or corresponding interface circuitry, as discussed above). Audio output device 704 may include any device that generates an audible indicator, such as speakers, headsets, or earbuds, for example.

Computing device 700 may include an audio input device 710 (or corresponding interface circuitry, as discussed above). Audio input device 710 may include any device that generates a signal representative of a sound, such as microphones, microphone arrays, or digital instruments (e.g., instruments having a musical instrument digital interface (MIDI) output).

Computing device 700 may include a GPS device 709 (or corresponding interface circuitry, as discussed above). GPS device 709 may be in communication with a satellite-based system and may receive a location of computing device 700, as known in the art.

Computing device 700 may include other output device 705 (or corresponding interface circuitry, as discussed above). Examples of the other output device 705 may include an audio codec, a video codec, a printer, a wired or wireless transmitter for providing information to other devices, or an additional storage device.

Computing device 700 may include other input device 711 (or corresponding interface circuitry, as discussed above). Examples of the other input device 711 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 700 may include a security interface device 712. Security interface device 712 may include any device that provides security measures for computing device 700 such as intrusion detection, biometric validation, security encode or decode, access list management, malware detection, or spyware detection.

Computing device 700, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The subject matter of the present description is not necessarily limited to specific applications illustrated in FIGS. 1-7. The subject matter may be applied to other deposition applications, as well as any appropriate manufacturing application, as will be understood to those skilled in the art.

The following examples pertain to further embodiments, and specifics in the examples may be used anywhere in one or more embodiments.

In one or more first embodiments, an integrated circuit (IC) device includes a ferroelectric capacitor including a first plate, wherein a first insulator is above the first plate and a second insulator is below the first plate, a second plate, wherein the second plate extends through the first plate and the first and second insulators, and a first width of a first portion of the second plate within the first plate is greater than both a second width of a second portion of the second plate within the second insulator and a third width of a third portion of the second plate within the first insulator, and a ferroelectric layer between the first and the second plates, wherein a bottom surface of the first portion and a bottom surface of the ferroelectric layer adjoin with a top surface of the second insulator.

In one or more second embodiments, further to the first embodiments, the first or second insulator contacts a sidewall of the second plate.

In one or more third embodiments, further to the first or second embodiments, a bottom surface of the first plate is substantially coplanar with the bottom surface of the ferroelectric layer.

In one or more fourth embodiments, further to the first through third embodiments, the second plate is coupled to one or more access transistors, and the first plate is coupled to a plateline.

In one or more fifth embodiments, a method includes forming an opening in an interleaved stack of insulator and sacrificial layers, recessing a sidewall of the sacrificial layers between the insulator layers, forming an inner plate in contact with the recessed sidewall and at least partially filling the opening, exposing a sidewall of the inner plate by removing the sacrificial layers, forming ferroelectric material on the exposed sidewall of the inner plate, and forming a plurality of ferroelectric capacitors by forming outer plates over the ferroelectric material.

In one or more sixth embodiments, further to the fifth embodiments, forming the opening includes exposing a metallization structure coupled to a source or drain contact of an access transistor below the interleaved stack of insulator and sacrificial layers.

In one or more seventh embodiments, further to the fifth or sixth embodiments, the method further includes electrically isolating adjacent ferroelectric capacitors by recessing conductive material between laterally adjacent outer plates and forming an insulator in the recess.

In one or more eighth embodiments, an integrated circuit (IC) device includes a first plate, a second plate, wherein the first plate extends through the second plate, a ferroelectric layer therebetween, wherein the first plate, the second plate, and the ferroelectric layer form a ferroelectric capacitor, and a first insulator above the second plate and a second insulator below the second plate, wherein an interface material is between the first plate and the first insulator and between the first plate and the second insulator.

In one or more ninth embodiments, further to the eighth embodiments, the ferroelectric layer contacts the first plate and the interface material is above and below the ferroelectric layer.

In one or more tenth embodiments, further to the eighth or ninth embodiments, the interface material includes a dielectric material.

In one or more eleventh embodiments, further to the eighth through tenth embodiments, the interface material is laterally between the first plate and the ferroelectric layer.

In one or more twelfth embodiments, further to the eighth through eleventh embodiments, the ferroelectric layer is between the first and second insulators.

In one or more thirteenth embodiments, further to the eighth through twelfth embodiments, the interface material includes a conductive material.

In one or more fourteenth embodiments, further to the eighth through thirteenth embodiments, the first plate is coupled to one or more select transistors, and the second plate is coupled to a plateline.

In one or more fifteenth embodiments, a method includes forming an opening in an interleaved stack of insulator and sacrificial layers, forming an etch-stop layer over a sidewall of the opening, forming an inner plate over the etch-stop layer and at least partially filling the opening, exposing the etch-stop layer by removing the sacrificial layers, forming ferroelectric material between the insulator layers, and forming a plurality of ferroelectric capacitors by forming outer plates over the ferroelectric material.

In one or more sixteenth embodiments, further to the fifteenth embodiments, the method further includes removing the etch-stop layer between the insulator layers, wherein forming ferroelectric material includes depositing ferroelectric material on an exposed sidewall of the inner plate.

In one or more seventeenth embodiments, further to the fifteenth or sixteenth embodiments, forming ferroelectric material includes depositing ferroelectric material over the etch-stop layer.

In one or more eighteenth embodiments, further to the fifteenth through seventeenth embodiments, the etch-stop layer includes a conductive material.

In one or more nineteenth embodiments, further to the fifteenth through eighteenth embodiments, forming the opening includes exposing a metallization structure coupled to a source or drain contact of a select transistor below the interleaved stack of insulator and sacrificial layers.

In one or more twentieth embodiments, further to the fifteenth through nineteenth embodiments, the method further includes electrically isolating adjacent ferroelectric capacitors by recessing conductive material between laterally adjacent outer plates and forming an insulator in the recess.

The disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. An integrated circuit (IC) device, comprising:
a stack of ferroelectric capacitors comprising:
a stack of first plates, wherein a first insulator layer is above each of the first plates, and wherein a second insulator layer is below each of the first plates;
a second plate, wherein the second plate extends through the stack of first plates and individual ones of the first and second insulator layers, and wherein a first width of a first portion of the second plate within individual ones of the first plates is greater than both a second width of a second portion of the second plate within a corresponding one of the second insulator layers and a third width of a third portion of the second plate within a corresponding one of the first insulator layers; and
a ferroelectric layer between sidewalls of the first plates and the second plate, wherein a bottom surface of the first portion of the second plate and a bottom surface of the ferroelectric layer are both in contact with the corresponding one of the second insulator layers, and wherein a top surface of the first portion of the second plate and a top surface of the ferroelectric layer are both in contact with the corresponding one of the first insulator layers.

2. The IC device of claim 1, wherein a sidewall of the first or second insulator layers is in contact with a sidewall of the second plate.

3. The IC device of claim 1, wherein a bottom surface of each of the first plates is substantially coplanar with the bottom surface of the ferroelectric layer.

4. The IC device of claim 1, wherein the second plate is coupled to one or more access transistors, and each of the first plates is coupled to an individual one of a plurality of platelines.

5. A method, comprising:
forming an opening in an interleaved stack of insulator layers and sacrificial layers;
exposing a portion of each of the insulator layers adjacent to the opening by recessing a sidewall of the sacrificial layers between the insulator layers;
forming an inner plate in contact with the exposed portion of each of the insulator layers by at least partially filling the opening with a conductive material;
exposing a sidewall of the inner plate by removing each of the sacrificial layers from between the insulator layers;
forming ferroelectric material on the exposed sidewall of the inner plate and in contact with the insulator layers; and
forming a plurality of ferroelectric capacitors by forming outer plates over the ferroelectric material, wherein each of the outer plates is between two of the insulator layers.

6. The method of claim 5, wherein forming the opening comprises exposing a metallization structure coupled to a source or drain contact of an access transistor below the interleaved stack of insulator and sacrificial layers.

7. An integrated circuit (IC) device, comprising:
a capacitor stack, comprising:
a first plate;
a stack of second plates, wherein the first plate extends through the stack of second plates;
a ferroelectric layer between the first plate and each of the second plates, wherein the ferroelectric layer is in contact with the first plate, and wherein the first plate, individual ones of the second plates, and the ferroelectric layer form a plurality of ferroelectric capacitors; and
a first insulator layer above each of the second plates and a second insulator layer below each of the second plates, wherein an interface material is between the first plate and each of the first insulator layers and between the first plate and each of the second insulator layers;
a plurality of platelines, each of the platelines connected to a corresponding one of the second plates; and
a select transistor coupled to the first plate.

8. The IC device of claim 7, wherein the ferroelectric layer contacts the first plate, contacts each of the second plates, and wherein the interface material contacts the ferroelectric layer.

9. The IC device of claim 7, wherein the interface material comprises a dielectric material.

10. The IC device of claim 7, wherein the ferroelectric layer is between the first insulator layers and the second insulator layers.

11. The IC device of claim 7, wherein the interface material comprises a conductive material.

12. A method, comprising:
forming an opening in an interleaved stack of insulator layers and sacrificial layers;
forming an etch-stop layer over a sidewall of the opening;
forming an inner plate over the etch-stop layer and at least partially filling the opening;
exposing sidewall portions of the etch-stop layer that are between the insulator layers by removing the sacrificial layers;
removing the exposed sidewall portions of the etch-stop layer while retaining sidewall portions of the etch-stop layer that are between the inner plate and the insulator layers;
forming ferroelectric material between the insulator layers;
forming a plurality of ferroelectric capacitors by forming outer plates by depositing metal between the insulator layers;
forming a plurality of platelines, each of the platelines connected to an individual one of the outer plates; and
forming a select transistor coupled to the inner plate.

13. The method of claim 12, wherein forming ferroelectric material comprises depositing ferroelectric material on an exposed sidewall of the inner plate.

14. The method of claim 12, wherein the etch-stop layer comprises a conductive material.

15. The method of claim 12, wherein forming the opening comprises exposing a metallization structure coupled to a source or drain contact of the select transistor below the interleaved stack of insulator and sacrificial layers.

* * * * *